US010197615B2

(12) United States Patent
Di Stefano et al.

(10) Patent No.: US 10,197,615 B2
(45) Date of Patent: Feb. 5, 2019

(54) PARTIAL DISCHARGE DETECTION SYSTEM AND METHOD WITH SYNCHRONIZATION

(71) Applicant: PRYSMIAN S.P.A., Milan (IT)

(72) Inventors: Antonio Di Stefano, Milan (IT); Roberto Candela, Milan (IT); Giuseppe Fiscelli, Milan (IT); Giuseppe Costantino Giaconia, Milan (IT)

(73) Assignee: PRYSMIAN S.p.A., Milan (IT)

( * ) Notice: Subject to any disclaimer, the term of this patent is extended or adjusted under 35 U.S.C. 154(b) by 762 days.

(21) Appl. No.: 14/433,250

(22) PCT Filed: Oct. 5, 2012

(86) PCT No.: PCT/EP2012/069710
§ 371 (c)(1),
(2) Date: Apr. 2, 2015

(87) PCT Pub. No.: WO2014/053187
PCT Pub. Date: Apr. 10, 2014

(65) Prior Publication Data
US 2015/0260777 A1 Sep. 17, 2015

(51) Int. Cl.
*G01R 31/12* (2006.01)
(52) U.S. Cl.
CPC ..... *G01R 31/1272* (2013.01); *G01R 31/1227* (2013.01)
(58) Field of Classification Search
CPC .......... G01R 31/1272; G01R 31/1227
(Continued)

(56) References Cited

U.S. PATENT DOCUMENTS

2006/0034611 A1\* 2/2006 Li ................ G06F 1/3215
398/135
2009/0177420 A1 7/2009 Fournier et al.
(Continued)

FOREIGN PATENT DOCUMENTS

JP 6-11534 1/1994
WO WO 00/77535 12/2000
(Continued)

OTHER PUBLICATIONS

"IEEE Standard for Low-Rate Wireless Networks", IEEE Computer Society, IEEE Std 802.15.4™-2015, 1 cover page and pp. 1-707, (2015).
(Continued)

*Primary Examiner* — Patrick Assouad
*Assistant Examiner* — Khristopher Yodichkas
(74) *Attorney, Agent, or Firm* — Finnegan, Henderson, Farabow, Garrett & Dunner, L.L.P.

(57) ABSTRACT

A partial discharge acquisition system includes: a synchronization signal sensor device including a sensor module structured to remotely detect a first synchronization electromagnetic signal generated by an alternate current electrical voltage associated with the operation of an electrical object and provide a corresponding first detected electrical signal; a transmitting device structured to irradiate a second synchronization electromagnetic signal related with the first detected electrical signal; a partial discharge detection apparatus including: a receiving device structured to receive the second synchronization electromagnetic signal and generate a corresponding received electrical signal representing at least a timing parameter of the alternate current electrical voltage, the receiving device and the transmitting device being configured to establish a wireless communication link defining a deterministic transmission delay.

19 Claims, 14 Drawing Sheets

(58) Field of Classification Search
USPC .......................................................... 324/536
See application file for complete search history.

(56) References Cited

U.S. PATENT DOCUMENTS

2009/0248327 A1* 10/2009 Montanari ......... G01R 31/1227
702/58
2011/0172938 A1* 7/2011 Gu ......................... G01D 4/002
702/62

FOREIGN PATENT DOCUMENTS

WO    WO 2006/122415    11/2006
WO    WO 2009/150627    7/2009

OTHER PUBLICATIONS

"Communication Under Rule 71(3) EPC", Intention to Grant by European Patent Office dated Aug. 1, 2016 in counterpart European Application No. 12 775 204.6-1568.
International Search Report from the European Patent Office for International Application No. PCT/EP2012/069710, dated Jul. 19, 2013.
Written Opinion of the International Searching Authority from the European Patent Office for International Application PCT/EP2012/069710, dated Jul. 19, 2013.

\* cited by examiner

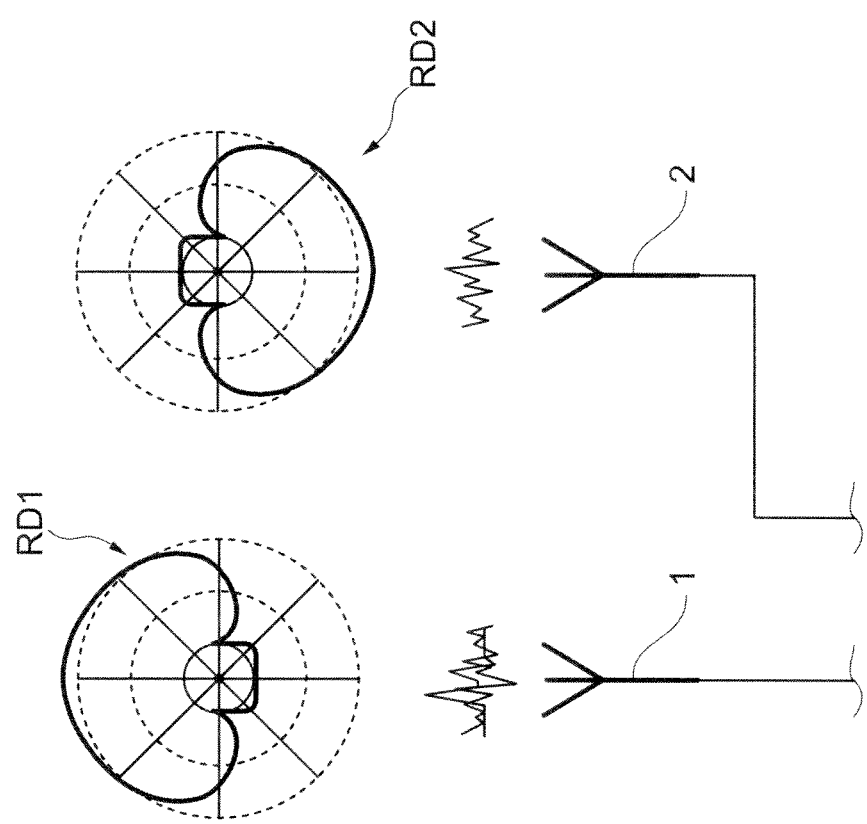

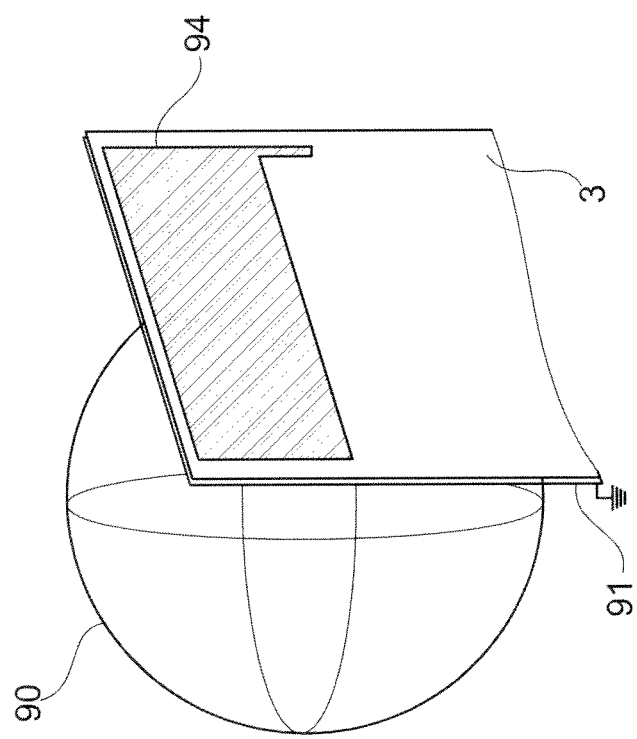
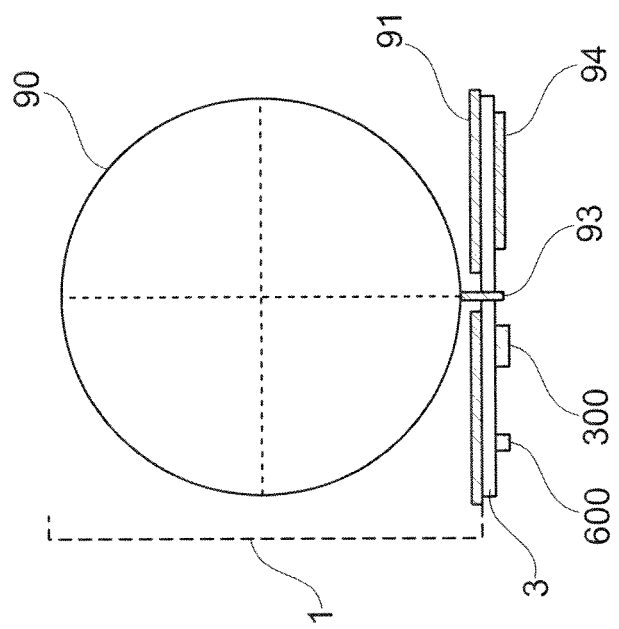

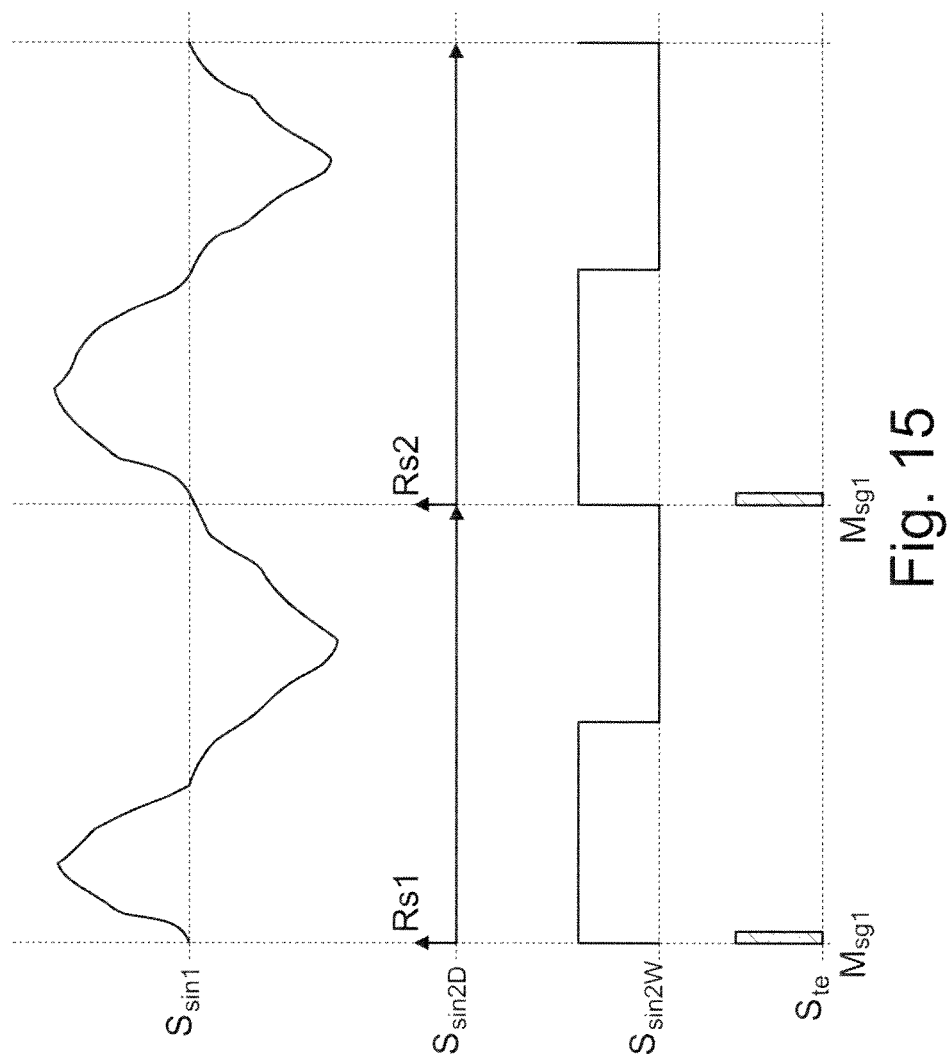

PARTIAL DISCHARGE DETECTION SYSTEM AND METHOD WITH SYNCHRONIZATION

BACKGROUND

Technical Field

The present invention relates to sensor devices configured to detect synchronization signals to be employed in partial discharge detection systems.

Description of the Related Art

Partial discharge detection is particularly used for identifying and measuring partial discharges in electrical components and apparatus, such as: medium, high or extra-high voltage cables, cable joints, overhead line insulators, medium and high voltage switchboard boxes, high and extra-high voltage cables using GIS (Gas Insulated Switchgear).

The term partial discharges is intended to indicate an undesired recombination of electric charges occurring in the dielectric (insulating) material of electric components, when the latter have defects of various types, eventually leading to dielectric destruction. Here, a pulse current is generated in portions of dielectric material and causes an electromagnetic wave to propagate through the power or ground cables of the relevant electric system, and radiating through the various surrounding media (dielectric material, metals, air, etc.).

For executing partial discharge measurements on AC (Alternate Current) electrical components it is important to have a phase reference signal, i.e. a signal that is synchronized in phase and frequency with the AC voltage powering the electrical component.

Document WO-A-2009-150627 describes, inter alia, a partial discharge detection device of small size, totally insulated and self-powered, which allows measurements to be performed with the highest safety with no need for direct connection to the system under examination. The device comprises a wide-band antenna adapted to act as an electric field sensor and including a first planar conductor (i.e. a ground plane) cooperating with a second conductor whose profile converges towards the first planar conductor at one point or one line. This partial discharge detection device can also detect a synchronization signal, which is obtained by picking up the supply voltage of the discharge generating components.

Document WO-A-2000-77535 discloses an apparatus for remotely monitoring the magnitude and direction of net electrical power and current flow to or from a facility over a prolonged period of time. The apparatus comprises a device for detecting and measuring the magnetic field emanating from the monitored lines, and another device for detecting a signal synchronized to the power system frequency, typically the electric field, emanating from the power lines.

Document JP-A-6-11534 discloses a partial discharge measuring system comprising a solenoid coil detection part which is provided at a power cable which is laid in a ductwork inside an underground manhole, the output signal is detected by a partial discharge detection part and then the detection signal is transmitted to the antenna of a manhole lid by a detection signal transmission part. A DC regulation power supply receives power from the cable by a transformer for receiving power supply. The applied voltage phase information of the cable is transmitted on the electric wave of a mobile telephone from a transmission terminal side substation provided with a voltage transformer. A partial voltage and applied voltage phase reception device which is provided near the manhole lid is provided with a radio signal reception part and a telephone signal reception antenna, obtains the partial discharge signal of the power cable under test and the applied voltage phase information signal, and then analyses the partial discharge pulse with the applied voltage phase as parameters.

BRIEF SUMMARY OF THE INVENTION

The Applicant experienced that a synchronization signal detection apparatus is necessary for referencing the partial discharge detection to the phase of the electrical voltage powering the electric object under test. In some instances, the synchronization detection by an apparatus directly associated with the partial discharge apparatus is difficult or impossible because in the position suitable for partial discharge detection the signal may be shielded, for example by electrical object coverings, or weak, or may not be effectively detected because of various reasons.

The Applicant found convenient to detect the synchronization signal in a position different from the location of the partial discharge detection provided that the transmission delay between the receiving device of the partial discharge detection apparatus and the transmitting device of the synchronization signal is positively assessed and taken into account in the partial discharge measurement.

The Applicant has noticed that the apparatus described by document JP-A-6-11534 does not allow an accurate detection of the synchronization signal, and the synchronization signal detected and subsequently transmitted by a mobile telephone does not represent a reliable reference signal.

The Applicant found that a wireless communication link defining a deterministic transmission delay could provide safe and reliable detection of a synchronization signal to a partial discharge acquisition system comprising a partial discharge detection apparatus and a sensor device configured to remotely detect the synchronization signal.

According to a first aspect, the present invention relates to a partial discharge acquisition system for inspecting operation of an electrical object, said system comprising:
  a synchronization signal sensor device comprising:
    a sensor module structured to remotely detect a first synchronization electromagnetic signal generated by an alternate current electrical voltage associated with the operation of the electrical object and provide a corresponding first detected electrical signal;
    a transmitting device structured to irradiate a second synchronization electromagnetic signal related with said first detected electrical signal; and
  a partial discharge detection apparatus comprising:
    a receiving device structured to receive said second synchronization electromagnetic signal and generate a corresponding received electrical signal representing at least one timing parameter of said alternate current electrical voltage;
    the receiving device and the transmitting device being configured to establish a wireless communication link defining a deterministic transmission delay.

Preferably, the receiving device and the transmitting device are structured so as that said wireless communication link is one of the following links: radio link, infrared link.

More preferably, said wireless communication link is a short-range link.

In case of short-range link, the receiving device and the transmitting device are structured so as that said short-range link is based on one of the following technologies: WiFi technology, ZigBee technology, Bluetooth technology. In accordance with another embodiment, said short-range link is based on IMS, Industrial Scientific Medical. Alternatively, the receiving device and the transmitting device are structured so as that said wireless communication link is based on one of the following radio links: Amplitude Modulation AM radio link, Frequency Modulation FM radio link, Short Wave SW radio link.

Preferably the receiving device and the transmitting device are structured so as that the deterministic transmission delay includes a latency lower than 100 μs.

Advantageously, the receiving device and the transmitting device are structured so as that said wireless communication link is based on continuous flux transmissions employing real-time and unbuffered streams.

Preferably, wherein the receiving device and the transmitting device are configured to operate according to a spreading code technique and according a frequency shift keying modulation.

In accordance with a particular embodiment, the detection system further comprises:
a further synchronization signal sensor device comprising:
a further sensor module structured to remotely detect a further first synchronization electromagnetic signal generated by a further alternate current electrical voltage associated with the operation of a further electrical object and provide a corresponding further first detected electrical signal;
a first transmitting-receiving device structured to irradiate a further second synchronization electromagnetic signal related with said further first detected electrical signal;
a further partial discharge detection apparatus comprising:
a second transmitting-receiving device structured to receive said further second synchronization electromagnetic signal and generate a corresponding further received electrical signal representing at least a further timing parameter of said further alternate current electrical voltage;
wherein at least one of said first transmitting-receiving device and said second transmitting-receiving device is configured to operate as intermediate node of a mesh network further including the transmitting device and the receiving device to establish said wireless communication link to transmit and receive said second synchronization electromagnetic signal.

Preferably, said partial discharge detection apparatus further includes:
a control module structured to evaluate the said deterministic transmission delay in a configuration step of the detection system;
a processing unit structured to shift a phase of the received electrical signal of said evaluated deterministic transition delay producing a shifted received electrical signal.

Advantageously, the partial discharge detection apparatus further includes:
a detection module configured to receive an electromagnetic signal associated with partial discharges of an electric component and to generate a first discharge electrical signal,
a digital-to-analog converter structured to produce from said first discharge electrical signal a plurality of corresponding samples representing the electromagnetic signal;
a memory configured to store selected samples of said plurality of samples;
a display device configured to display a discharge trend corresponding to said selected samples and synchronized with the shifted received electrical signal.

Preferably, the transmitting device is provided with an extracting module configured to extract timing parameters carried by the first detected electrical signal and generate a synthesized signal basing on said first detected electrical signal.

Advantageously, the extracting module comprises:
a measuring module for measuring said timing parameters;
a generation module to synthetize from said timing parameters the synthesized signal having a square wave shape.

In the case the synthesized signal is generated, the transmitting device further preferably includes: a message generator configured to generate a message at each rising edge of the synthetized signal.

In accordance with an embodiment, said a sensor module further includes:
a sensor module output;
a first sensor device structured to remotely detect the first synchronization electromagnetic signal and provide a corresponding first voltage signal on a first output;
at least second sensor device structured to remotely detect the first synchronization electromagnetic signal and provide a second voltage signal on a second output;
a selection module to select the first sensor device or the at least second sensor device by selectively connecting the first output and the second output to said sensor module output.

Preferably, said first sensor device includes at least one of the following sensors: a capacitive sensor, a magnetic sensor and an optical sensor. Advantageously, the optical sensor is configured to pick-up a luminous signal generated by a light source fed by the alternate current electrical voltage and to generate a third voltage signal on a third output.

In accordance with a second aspect the present invention relates to a partial discharge acquisition method for inspecting operation of an electrical object, said method, comprising:
remotely detecting a first synchronization electromagnetic signal generated by an alternate current electrical voltage associated with the operation of the electrical object and provide a corresponding first detected electrical signal;
providing a transmitting device configured to process said first detected electrical signal;
irradiating by the transmitting device a second synchronization electromagnetic signal related with said first detected electrical signal;
providing a partial discharge detection apparatus comprising a receiving device;
establishing a wireless communication link between the receiving device and the transmitting device associated with a deterministic transmission delay;
receiving at said receiving device the second synchronization electromagnetic signal and generate a corresponding received electrical signal representing at least a timing parameter of said alternate current electrical voltage.

In the present description and claims, as "a sensor device structured to remotely detect an electromagnetic signal produced by a source" it is meant the detection is performed wireless and contactless, i.e. without wires or cables connecting the source and the sensor device and without physical contacts.

In the present description and claims, as "transmission delay of a communication link" it is meant a time specifying how long it takes for a bit of data to travel across the communication link from one endpoint to another endpoint.

The transmission delay includes several contributions: a processing delay, a propagation delay and a latency. The processing delay is the time needed for detecting (by means of digital processing algorithms), encoding and modulating the signal. The propagation delay is time for a signal to reach its destination on the propagation medium. The latency is a time offset (fixed or variable) experienced by the signal during the path going from the transmitter to the receiver. It is commonly, but not exclusively, associated with buffering and routing.

In the present description and claims, as "deterministic transmission delay of a communication link" it is meant that the transmission delay can be evaluated, as an example in a configuration step, and this evaluated transmission delay is substantially the same for each communication session performed on said communication link.

In the present description and claims, as "directional antenna" is meant an antenna radiating or receiving electromagnetic waves more effectively in some directions than others. In particular, as "directional antenna" it is meant an antenna having a Front/Back ratio greater than 0 dB, preferably greater than 1 dB. The Front/Back parameter, expressed in decibel, is the ratio between the gain parameter associated with the main lobe of the radiation pattern and the gain parameter associated with the opposite lobe of the radiation pattern. The gain parameter of an antenna is the ratio of the power produced by the antenna from a far-field source on the antenna's beam axis to the power produced by a hypothetical lossless isotropic antenna, which is equally sensitive to signals from all directions.

In the present description and claims, with reference to antenna, as "receiving direction of signals" or "incoming direction of signals" is meant the direction which the signals are assumed to come from.

In the present description and claims, as "effective area" of an antenna is meant a measure of how effective an antenna is at receiving the power of electromagnetic waves at each incoming direction. The effective area of an antenna is dependent on another parameter characterizing the antenna behaviour which is the directivity of the antenna. In the present description the terms "effective area" and "directivity" will be both used as alternative parameters characterizing the capability of receiving power from particular incoming direction of an antenna.

For the purpose of the present description and of the appended claims, except where otherwise indicated, all numbers expressing amounts, quantities, percentages, and so forth, are to be understood as being modified in all instances by the term "about". Also, all ranges include any combination of the maximum and minimum points disclosed and include any intermediate ranges therein, which may or may not be specifically enumerated herein.

BRIEF DESCRIPTION OF THE DRAWINGS

Further characteristics and advantages will be more apparent from the following description of a preferred embodiment and of its alternatives given as a way of an example with reference to the enclosed drawings in which:

FIG. 8 shows a first radiation diagram of the first antenna and a second radiation diagram of the second antenna;

FIGS. 14A and 14B show two different views of a particular embodiment of the partial discharge acquisition system in accordance with FIG. 6;

FIG. 15 shows examples of trends of signals involved in the operation of the partial discharge acquisition system.

DETAILED DESCRIPTION

Figure 1:
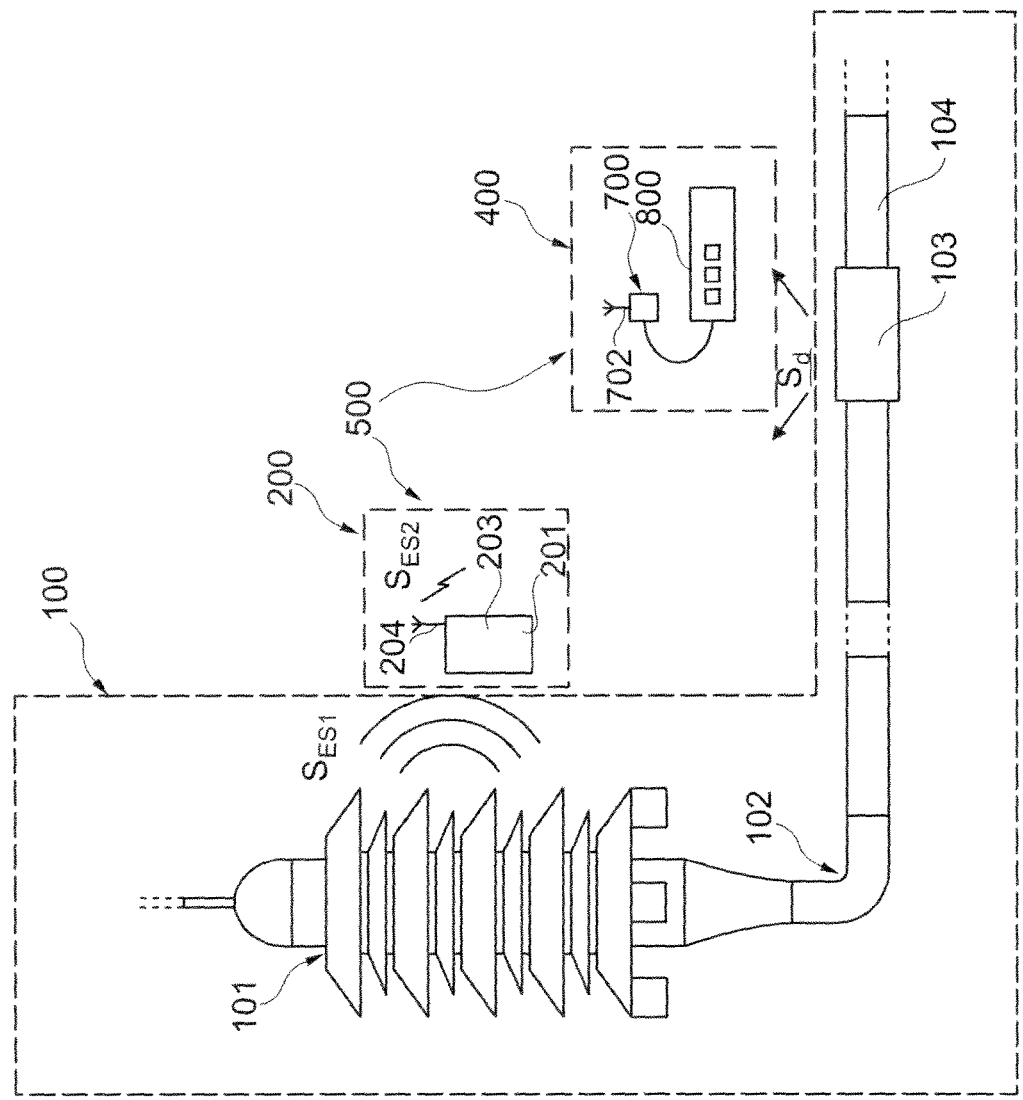
FIG. 1 shows an example of an electrical apparatus and an embodiment of a partial discharge acquisition system comprising a synchronization signal sensor device and a partial discharge detection apparatus.

In the following description, same alphanumeric references are used for analogous exemplary elements when they are depicted in different drawings. FIG. 1 shows an example of an electrical apparatus 100 and a particular embodiment of a partial discharge acquisition system 500 comprising a synchronization signal sensor device 200 and a partial discharge detection apparatus 400. The partial discharge acquisition system 500 is an electronic apparatus employable to detect, measure and/or analyse partial discharges generated by electrical sources, as the electrical apparatus 100 itself.

The electrical apparatus 100 can include any kind of electrical components, devices, apparatuses or systems such as an example: a medium or high voltage cable, a cable joint, an overhead line insulator, a medium or high voltage switchboard box, a medium or high voltage termination, a high and extra-high voltage cable using GIS (Gas Insulated Switchgear), an electric motor or generator or a medium or high voltage transformer.

Particularly, the electrical apparatus 100 includes a first electrical device 101, such as an example, a medium or high voltage termination (MV/HV termination) as shown in FIG. 1, which is fed with an AC (Alternate Current) electrical voltage by means of a first electrical cable 102. The MV/HV termination 101 is adapted to produce and irradiate a first electromagnetic signal $S_{ES1}$ generated by and synchronized with the AC electrical voltage. Typically, AC electrical voltage has a frequency comprised between 1 Hz to about 1000 Hz.

In accordance with the embodiment described, the electrical apparatus 100 further includes a second electrical device 103, such as an example, a cable joint or a cross-bond joint which joints the first electrical cable 102 with a second electrical cable 104. The cable joint 103 can produce partial discharge electromagnetic impulsive signals $S_d$.

Figure 2:
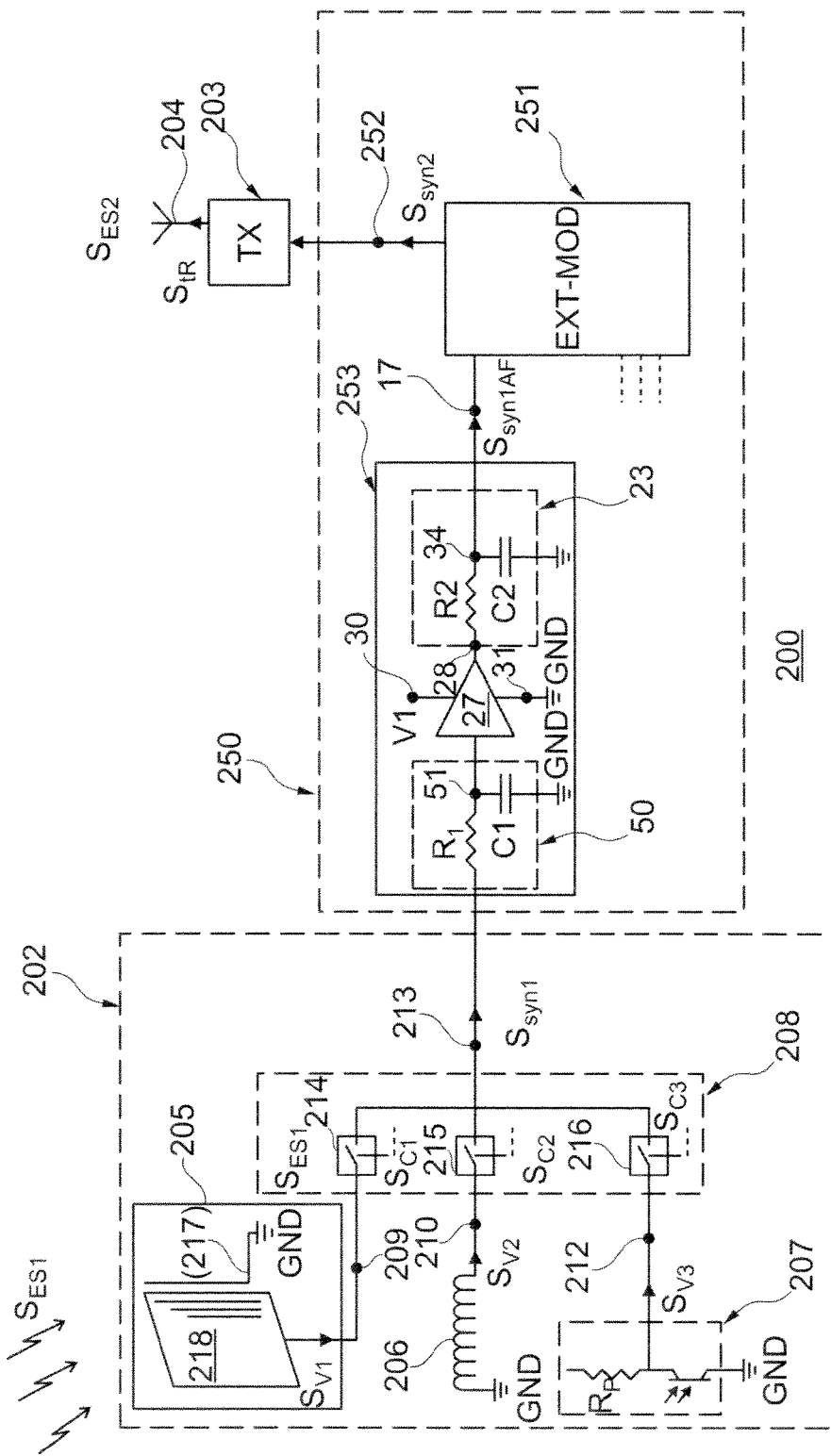
FIG. 2 shows an embodiment of the synchronization signal sensor device provided with a sensor module, a signal processing module, a timing information extracting module, a transmission module and a first antenna device.

Making also reference to FIG. 2, the synchronization signal sensor device 200 is portable and comprises a case 201 (FIG. 1) provided with a sensor module 202, a transmitting module 203 (TX) and a first antenna device 204. The sensor module 202 is structured to remotely detect the first electromagnetic signal $S_{ES1}$ and provide a corresponding first synchronization electrical signal $S_{syn1}$ on an electrical terminal 213.

In particular, with the expression "remote detection of an electromagnetic signal produced by a source" it is meant that the detection is performed wireless and contactless, i.e. without wires or cables connecting the source and the sensor device and without physical contact. As an example, the remote detection can be performed at a distance from the signal source of from 1 cm to 10 m.

FIG. 1 further shows an example of the partial discharge detection apparatus 400 comprising a receiving module 700, a second antenna device 702 and a detection module 800.

It is observed that the transmitting module 203 of the synchronization signal sensor device 200 and the receiving module 700 of the partial discharge detection apparatus 400 are structured to establish a wireless communication link in accordance with a communication technology defining a deterministic transmission delay. This wireless communication link is to be employed, particularly, to transmit signals related to the first synchronization electrical signal $S_{syn1}$ and so corresponding to the first electromagnetic signal $S_{ES1}$. More particularly, the transmitting module 203 and the receiving module 700 are structured to establish a point-to-point connection.

The transmission delay of a communication link is a time specifying how long it takes for a bit of data to travel across from one endpoint to another endpoint. The transmission delay includes several contributions: a processing delay, a propagation delay and latency. The processing delay is the time needed for detecting (by means of digital processing algorithms), encoding and modulating the signal. The propagation delay is time for a signal to reach its destination on the propagation medium. The latency is a time offset (fixed or variable) experienced by the signal during the path going from the transmitter to the receiver and can is commonly, but not exclusively, associated with buffering and routing steps. Particularly, the communication link established between the transmitting module 203 and the receiving module 700 shows a latency lower than 100 μs.

It is observed that, preferably, the use of error correction techniques can be avoided on the wireless communication link for signals corresponding to the first synchronization electrical signal $S_{syn1}$. However, error correction techniques showing substantially negligible transmission delays, i.e. delays lower than 100 μs, can be employed. Error detecting algorithms can be employed on the wireless communication link for signals corresponding to the first synchronization electrical signal $S_{syn1}$ to eliminate corrupted data/messages. Error detecting algorithms cause deterministic delays that can be evaluated as a contribution to the transmission delay.

In accordance with a particular embodiment, the transmitting module 203 is structured to generate a transmission electrical signal $S_{te}$ in short-range radio technology and depending on said first synchronization electrical signal $S_{syn1}$. The "short-range radio technology" defines a radio link having the following characteristics:

the radio link has a maximum operative rage of about 1 km;

low power transmission $P_t$ is employed, i.e. $P_t<1$ W.

Preferably, the employed short-radio link operates at frequency bands allocated for a specific purpose and usually free to use (unlicensed), such as an example the ISM (Industrial, Scientific and Medical) bands.

In accordance with another embodiment, the wireless communication link can be based on infrared technology and can be one of the following short-range techniques: WiFi technique (standard IEEE 802.15.4), ZigBee technique (IEEE 802.15.4), or Bluetooth technique.

Examples of employable radio link technologies which can be non-short-range based are: Amplitude Modulation technology, Frequency Modulation technology and short wave technology.

With reference to other aspects of the wireless communication link the synchronization signal sensor device 200 and the receiving module 700 are preferably structured so that said wireless communication link is based on continuous flux transmissions employing real-time and unbuffered streams. In continuous flux transmissions the information is not formatted in units of data, i.e. packets, but is continuously transmitted. The real time and the un-buffered stream techniques introduce deterministic contribution to the transmission delay since no unpredictable data memorization or data accumulation is performed.

As an example, continuous flux transmissions employing real-time and unbuffered stream are different from time division multiplexing schemes, packet switching techniques and from non-deterministic packet/circuit switching schemes.

The following description refers to the particular case of short-range radio technology. The first antenna device 204 is configured to receive said transmission electrical signal $S_{te}$ and irradiate a corresponding second synchronization electromagnetic signal $S_{ES2}$.

The synchronization signal sensor device 200 can be implemented in a printed circuit board. Referring back to the sensor module 202 it includes a single sensor device or a plurality of selectable sensor devices which allow remote detection of the first electromagnetic signal $S_{ES1}$, such as capacitive sensors (e.g. plates or wires) and magnetic sensors (e.g. coils). In addition or in alternative to the sensor devices detecting the first electromagnetic signal $S_{ES1}$, indirect sensor devices adapted to remotely detect and convert into electrical signals luminous or acoustic phenomena induced in surrounding media by the AC electrical voltage can be used. As an example, these indirect sensor devices can be configured to detect: light or vibration from one or more of the objects of the electrical apparatus 100, such as an example, light can be detected from gas discharge lamps or hum and vibrations can be detected from ferromagnetic or piezoelectric materials.

With reference to the particular embodiment of FIG. 2, the sensor module 202 is provided with at least one of the following sensors: a capacitive sensor 205, a magnetic sensor 206 and an optical sensor 207.

The capacitive sensor 205 can be implemented by a wire 217 or preferably, by a metallic plate 218, kept at high impedance. The metallic plate 218 is geometrically more exposed to the electric field than local voltage reference (ground terminals). The electric field associated with the first electromagnetic signal $S_{ES1}$ can induce in the metallic plate 218 a first voltage signal $S_{V1}$, on a first terminal 209, smaller than the AC electrical voltage and instantaneously proportional to it. In accordance with a particular embodiment, the metallic plate 218 is implemented as a large copper pad in the bottom layer of the printed circuit board or as a stand-alone separated conductive plate connected to the circuit, preferably with a dimensions equal or greater than 70×50 mm. Preferably, ground trace areas on the circuit board are kept as small as possible compared to the metallic plate 218, or less exposed to the electric field (by means of geometric design or proper shielding) so that the induced voltage is not equal for the two and so a small voltage difference can be measured. A circuit layer of the printed circuit board laying on a side opposite to the one on which the metallic plate 218 is integrated, which is by design less exposed to the electric field, can host ground traces and further electronic components.

The magnetic sensor 206 can be a coil, designed to pick-up magnetic flux associated with the first electromagnetic signal $S_{ES1}$ and generated by the AC currents flowing in the HV/MV termination 101 or the second electrical cable 104 and provide a second voltage signal $S_{V2}$ proportional to it on a second terminal 210. The coil of the magnetic sensor 206 can be wound as a solenoid along a specific axis, so to provide a good directivity. In operation, the magnetic sensor 206 provides a voltage difference, i.e. the second voltage signal $S_{V2}$, that is proportional to the derivate of the magnetic flux passing through it, generated by the current flowing through the component. In accordance with an example, the coil of the magnetic sensor 206 comprises about 20 to 50 turns of copper wires wound as a solenoid, preferably around a ferromagnetic core with a rod shape (preferably about 4 to 10 cm long). Other types of magnetic sensors can be used, such as Hall effect sensors.

The light sensor 207 comprises a photo detector 211 (provided with suitable polarization circuit schematized by a polarization resistor Rp) and is configured to pick-up the luminous signal generated by lamps and indicators (not shown in the figures) fed by the AC electrical voltage and generate a third voltage signal $S_{V3}$ on a third terminal 212. The luminous flux generated by these lamps and indicators and the third voltage signal $S_{V3}$ are synchronous and in phase with the AC voltage but they are not proportional to the AC voltage and have a doubled frequency with respect to it. The luminous flux is proportional to the square of the electrical field associated with the AC voltage so the light is emitted twice in each period, showing a frequency which is equal to twice the frequency of the AC voltage. It is observed that the frequency doubling effect also occurs if vibrations are detected.

In accordance with an example, the photo detector 211 is a photodiode or a phototransistor which can detect the luminous signal from neon indicator lamps, commonly found in MV/HV panels. It is observed that the capacitive sensor 205 can provide the first voltage signal $S_{V1}$ which substantially does not show phase errors over the AC electric voltage. Particularly, the magnetic sensor 206 and the optical sensor 207 could be employed if the capacitive sensor 208 cannot be used (this may happen in pits, or heavily grounded or shielded locations). Magnetic sensor 206 can be also conveniently used to check if a line, such as the first cable 102, is powered or it is not powered (i.e. a current is flowing).

In accordance with the particular embodiment described, the sensor module 202 comprises a switching module 208 structured to selectively connect the first terminal 209, the second terminal 210 and the third terminal 212 to the electrical terminal 213 so selecting as first synchronization electrical signal $S_{sym1}$ one signal among the first voltage signal $S_{V1}$, the second voltage signal $S_{V2}$ and third voltage signal $S_{V3}$. The switching module 208 can be an analog multiplexer or can comprise a plurality of analog switches 214-216. Particularly, the switching module 208 comprises a first switch 214 structured to connect/disconnect the first terminal 209 to/from the electrical terminal 213, a second switch 215 structured to connect/disconnect the second terminal 210 to/from the electrical terminal 213, a third switch 216 structured to connect/disconnect the third terminal 212 to/from the electrical terminal 213. The first switch 214, the second switch 215 and third switch 216 can be switched by means of a first control signal $S_{C1}$, a second control signal $S_{C2}$ and a third control signal $S_{C3}$, respectively. Each of the first switch 214, the second switch 215 and third switch 216 can comprises one or more transistors controlled by the first control signal $S_{C1}$, the second control signal $S_{C2}$ and the third control signal $S_{C3}$, respectively.

Particularly, the synchronization signal sensor device 200 further includes a signal processing module 250 connected between the electrical terminal 213 and the transmitting module 203 and comprising an extracting module 251 (EXT-MOD) and, as an example, an electronic processing module 253. The extracting module 251 (EXT-MOD) shows an output 252 connected to an input port of the transmitting module 203 and is configured to extract timing information carried by the first synchronization electrical signal $S_{sym1}$ and to be provided to the transmitting module 203. The electronic processing module 253 is configured to perform noise filtering and/or amplification of the first synchronization electrical signal $S_{sym1}$ and provide a processed synchronization electrical signal $S_{sym1AF}$ on a first input terminal 17 of the extracting module 251.

Particularly, the electronic processing module 253 comprises an optional input low pass filtering module 50, an amplifier module 27, and an optional output low pass filter 29.

According to an example, the input low pass filtering module 50 includes a first resistor R1, connected between the electrical terminal 213 and a first node 51, and a first capacitor C1 connected between the first node 51 and a ground terminal GND. The amplifier module 27, such as a high gain buffer amplifier, has an input connected the first node 51 and a first output terminal 28 connected to the second low pass filter module 29.

The high gain buffer amplifier 27 is also provided with a first supply terminal 30 for a supply voltage V1 and a second supply terminal 31 connected to the ground terminal GND. As an example, the high gain buffer amplifier 27 is an instrumentation voltage amplifier and has a gain greater than 1000. Moreover, the high gain buffer amplifier 27 shows an input-output impedance ≥1 MOhm and can have an overall bandwidth lower than 1 kHz. The low pass filter module 29 includes, as an example, a second resistor R2, connected between the first output terminal 28 and a second node 34, and a second capacitor C2 connected between the second node 34 and the ground terminal GND. The second node 34 is connected to the first input terminal 17 of the extracting module 251. The first low pass filter 50 and the second low pass filter 29 are configured to cut frequencies above about 1 kHz in order to reduce noise.

Figure 3:
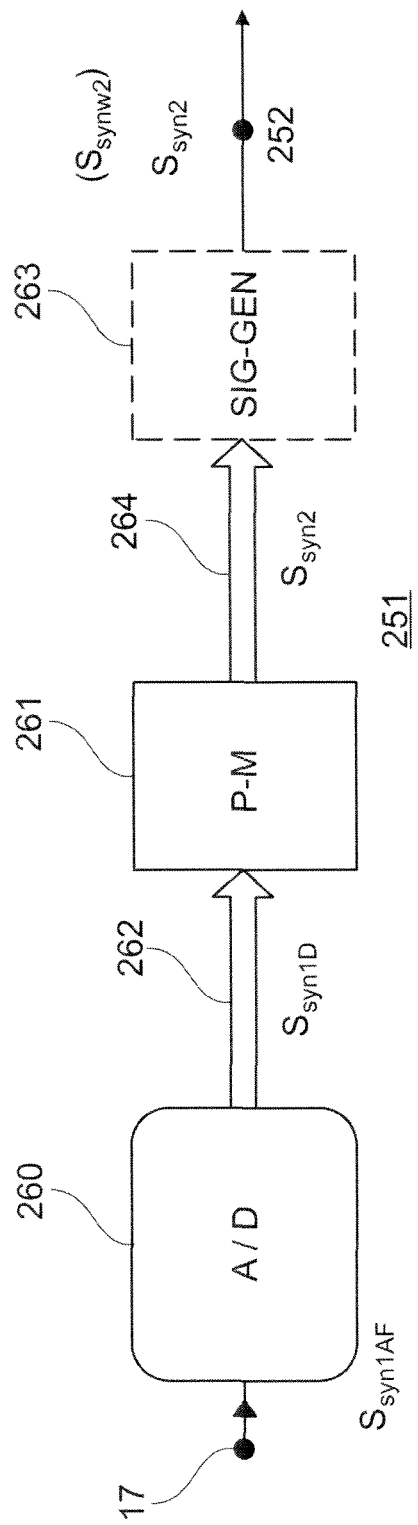
FIG. 3 shows a first embodiment of the extracting module comprising an analog-to-digital-converter, a parameter measuring module and an optional signal generation module.

The extracting module 251 can be implemented as an analog circuit or a digital circuit, particularly, via software. According to the desired behavior and performances, different timing extraction algorithms can be used. FIG. 3 shows by functional modules a particular example of the extracting module 251 implementable by a software executed on a computer, such as a microcontroller, and comprising an analog-to-digital-converter 260 (A/D), a parameter measuring module 261 (P-M) and an optional signal generation module 263 (SIG-GEN).

The digital-converter 260 (A/D) is configured to receive an analog signal (i.e. the processed synchronization electrical signal $S_{syn1A}$) and performing sampling, quantization and coding operations so to provide a digital signal $S_{syn1D}$ to a first output of the parameter measuring module 261 by a first bus 262. The parameter measuring module 261 is configured to track the rising and/or falling edges of the digital signal and measure its period T as by counting clock pulses between two events, such as to subsequent falling or raising edges. The parameter measuring module 261 allows generating a second synchronization electrical signal $S_{syn2}$ which can be a message carrying measured timing information such as period T and phase of the digital signal $S_{syn1D}$. The second synchronization electrical signal $S_{syn2}$ can be sent to the output 252.

The optional generation module 263 (SIG-GEN) is configured to receive on a second bus 264 the message associated with the second synchronization electrical signal $S_{syn2}$ representing the timing information, and generate a synthetized second synchronization electrical signal $S_{synw2}$ having the form of a square wave showing period T and, as an example, a duty cycle equal to T/2.

It is observed that the generation of the synthetized second synchronization electrical signal $S_{synw2}$ allows to obtain a stable and clean signal, since the detected first synchronization electrical signal $S_{syn1}$ may be affected, as an example, by noise, random transitions, improper duty cycle or black-out intervals. This unwished behavior of the first synchronization electrical signal $S_{syn1}$ can be easily eliminated in the synthetized second synchronization electrical signal $S_{synw2}$ by configuring the generation module 263 so as to update the period and duty cycle detected by the measurement module 261 of the second synchronization electrical signal $S_{syn2}$ with a low pass behavior, that intrinsically filters out transitory noisy and unstable input signals.

It is noticed that if the optical sensor 207 is selected, the period and the duty cycle carried by the second synchronization electrical signal $S_{syn2}$ or associated with the synthetized second synchronization electrical signal $S_{synw2}$ is obtained by multiplying by two the period measured by the parameter measuring module 261. Moreover, it has been noticed that the embodiment of FIG. 3 is not complex to be implemented and does not require a precise tuning.

Figure 4:
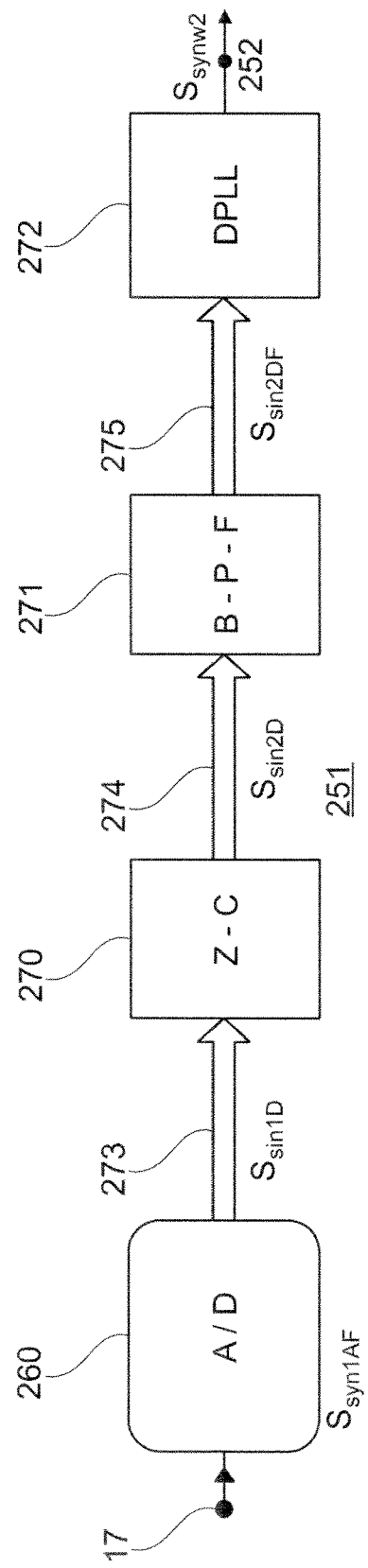
FIG. 4 shows a second embodiment of the extracting module comprising an analog-to-digital-converter, a zero-crossing detector, a band-pass filter and a signal Digital Phase Locked Loop module.

FIG. 4 shows by functional modules an alternative embodiment of the extracting module 251 implementable, as an example, by a software executed on a microcontroller and comprising the analog-to-digital-converter 260 (A/D), a zero-crossing detector 270 (Z-C), a band-pass filter 271 (B-P-F) and a signal Digital Phase Locked Loop module 272 (DPLL). The example of FIG. 4 refers to a case in which the synthetized second synchronization electrical signal $S_{synw2}$ is provided on the output 252. Reference it is also made to FIG. 15 wherein examples of some trends of the described signals are shown.

The digital-converter 260 (A/D) is configured to provide a corresponding digital signal $S_{sin1D}$ to an input of the zero-crossing detector 270 by a third bus 273. The zero-crossing detector 270 is structured to receive the digital signal $S_{sin1D}$ and detect the instant points in which the digital signal $S_{sin1D}$ changes its sign from a negative value towards a positive value and vice versa so determining rising and/or falling edges. Particularly, the zero-crossing detector 270 can provide on a fourth bus 274 digital data $S_{sin2D}$ representing a pulse train $R_{s1}$ and $R_{s2}$ in which each pulse is positioned in the zero-crossing instants so substantially having the period T of the first synchronization electrical signal $S_{syn1}$. The band-pass filter 271 is configured to perform a band-pass filtering to remove noise or other unwished components from the pulse train and send the filtered digital signal $S_{sin2DF}$ to the DPLL module 272 by a fifth bus 275. The DPLL module 272 is configured to generate the synthetized second synchronization electrical signal $S_{synw2}$ locked to the pulse train provided by the band-pass filter 271 and having the form of a square wave showing period T and a duty cycle equal to T/2.

The generation of the second synchronization electrical signal $S_{syn2}$ or of the synthetized second synchronization electrical signal $S_{synw2}$ by the extracting module 251 represented in FIG. 3 or FIG. 4 can be also performed by means of hardware digital circuits or by analogical electronic circuit, as an example, implementing all or some of the modules of FIG. 4.

Referring back to the transmitting module 203 (FIG. 2), it is configured to generate and transmit the transmission electrical signal $S_{te}$ (an example is shown in FIG. 15) starting, as an example, from the synthetized second synchronization electrical signal $S_{synw2}$. In accordance with an example, the transmitting module 203 is a radio transmitter programmed to send, at each rising edge of the synthetized second synchronization electrical signal $S_{synw2}$ a short message containing the timing information carried out by the synthetized second synchronization electrical signal $S_{synw2}$. The short message can be a simple beacon or a real message containing digital information such as an identification of the synchronization signal sensor device 200 and the frequency (i.e. the reciprocal of the period T) of the synthetized first synchronization electrical signal $S_{synw2}$ as measured by the parameter measuring module 261 (P-M) of FIG. 3.

A data representing the frequency of the synthetized first synchronization electrical signal $S_{synw2}$ is therefore included in the payload of the message associated with the transmission electrical signal $S_{te}$.

Figure 5:
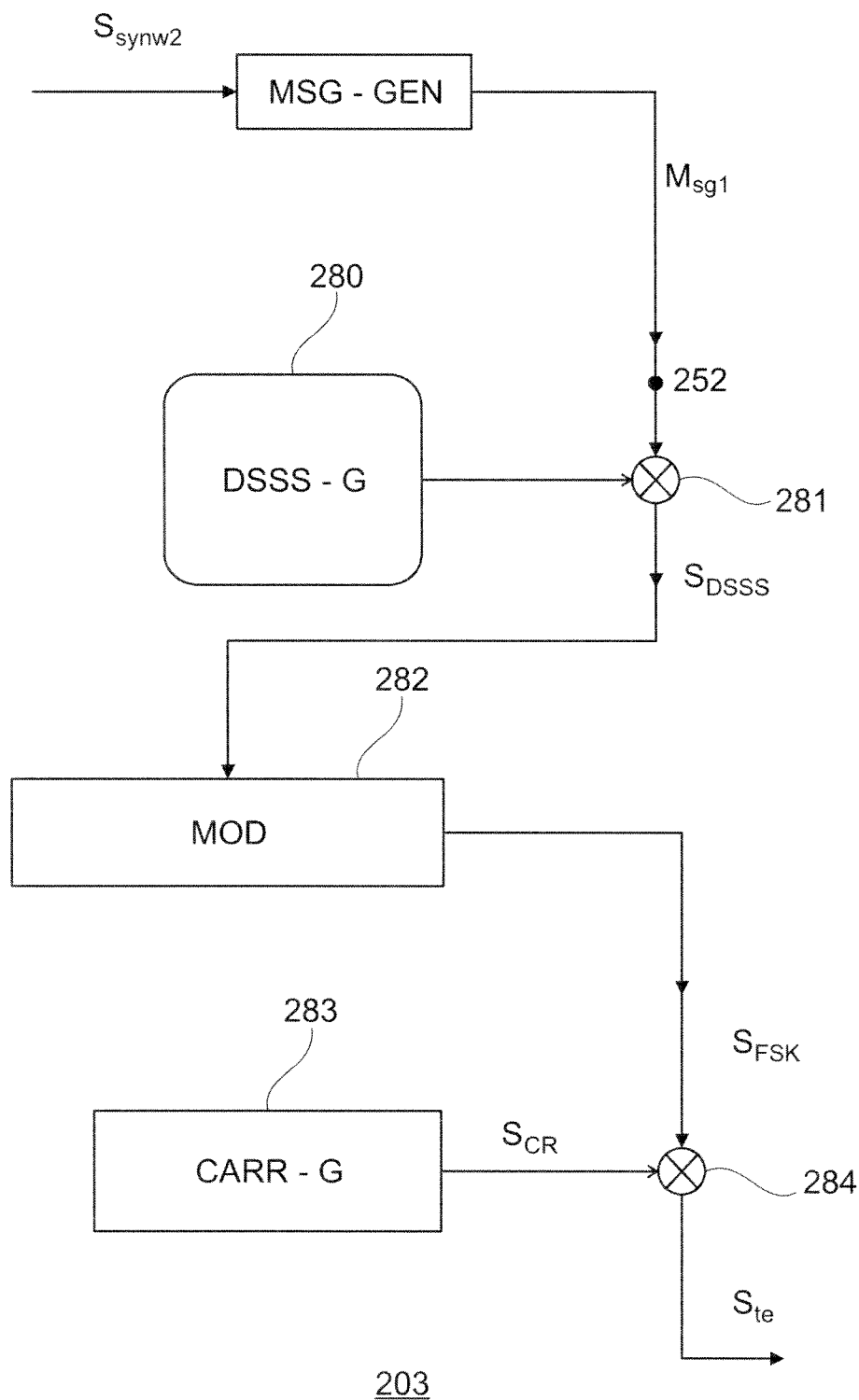
FIG. 5 shows a particular embodiment of the transmission module illustrated in FIG. 2 and configured to employ a Direct Sequence Spread Spectrum technique.

FIG. 5 shows schematically a particular embodiment of the transmission module 203 configured to employ a Direct Sequence Spread Spectrum technique (DSSS). The transmission module 203 of FIG. 5 comprises: a message generator 285 (MSG-GEN), a spreading code generator (DSSS-G) 280, a multiplier 281, a modulator (MOD) 282, a carrier generator (CARR-G) 283 and a frequency converter 284.

The message generator 285 is configured to receive the synthetized first synchronization electrical signal $S_{synw2}$ and produce a corresponding transmission messages Msg1. Particularly, the coder message generator 285 is structured to produce a message at each rising edge of the synthetized second synchronization electrical signal $S_{synw2}$, containing the timing information carried out by the synthetized second synchronization electrical signal $S_{synw2}$ Direct-sequence spread-spectrum transmissions multiply the data being transmitted by a pseudorandom sequence of 1 and −1 values, at a frequency much higher than that of the original signal. Particularly, the spreading code generator (DSSS-G) 280 is configured to generate the pseudorandom sequence. The multiplier 281 allows to multiply the first message Msg1 with the pseudorandom sequence to generate a first modulated signal $S_{DSSS}$. As an example, the pseudorandom sequence can be generated according to one of the present codes: Barker code, Gold code, Manchester code, or the codes of the standard IEEE 802.15.4.

The modulator 282 is configured to impart a modulation to the first modulated signal $S_{DSSS}$ producing a second modulated signal $S_{FSK}$. Particularly, the modulator 282 is configured to perform a frequency modulation such as an example, the Frequency Shift Keying (FSK) or Gaussian Frequency Shift Keying (GFSK) modulations. It is noticed that the DSSS technique and FSK or GFSK modulations allow achieving good noise immunity and predictable timings. As an example, a GFSK modulation using a carrier at 868 MHZ, a frequency shift of 50 kHz and a bandwidth of 200 kHz can be employed.

The carrier generator 283 is structured to generate a carrier signal $S_{CR}$ and the frequency converter 284 is configured to multiply the second modulated signal $S_{FSK}$ by the carrier signal $S_{CR}$ so producing the transmission signal $S_{te}$ to be supplied to the first antenna device 204. Particularly, the carrier frequency of the carrier signal $S_{CR}$ is a Radio Frequency and can be chosen as one of the ISM bands (433, 868, 2400 MHz), preferably the 868 MHz band, due to its lower noise and good ranging performances. The industrial, scientific and medical (ISM) radio bands are radio bands (portions of the radio spectrum) reserved internationally for the use of radio frequency (RF) energy for industrial, scientific and medical purposes other than communications.

In accordance with a particular embodiment, the synchronization signal sensor device 200 is also provided with a light emitting device or other display devices (not shown) suitable to indicate to a user the effective status of the synchronization signal sensor device 200 and which sensor has been selected among the magnetic sensor 206, the optical sensor 207 and the capacitive sensor 208. As an example, a LED (light emitting diode) can be used as light emitting device. The synchronization signal sensor device 200 preferably comprises one or more batteries to supply electrical energy to the devices included in the synchronization signal sensor device 200. Alternatively, the synchronization signal sensor device 200 can be powered by electrical cable, as an example, connected to the partial discharge detection apparatus 400.

It is observed that, as already described above, in accordance with another embodiment, the transmitting module 203 can be structured to operate the infrared frequencies (405 THz-300 GHz) to establish an infrared short-range link with the partial discharge detection apparatus 400. The above mentioned definition of radio short-range link applies to the infrared short-range link.

As indicated above, infrared short-range technology can be employed in this case the first antenna 204 and the second antenna 702 are replaced by suitable corresponding optical transceivers structured to convert an electrical signal into an optical signal and viceversa.

Figure 6:
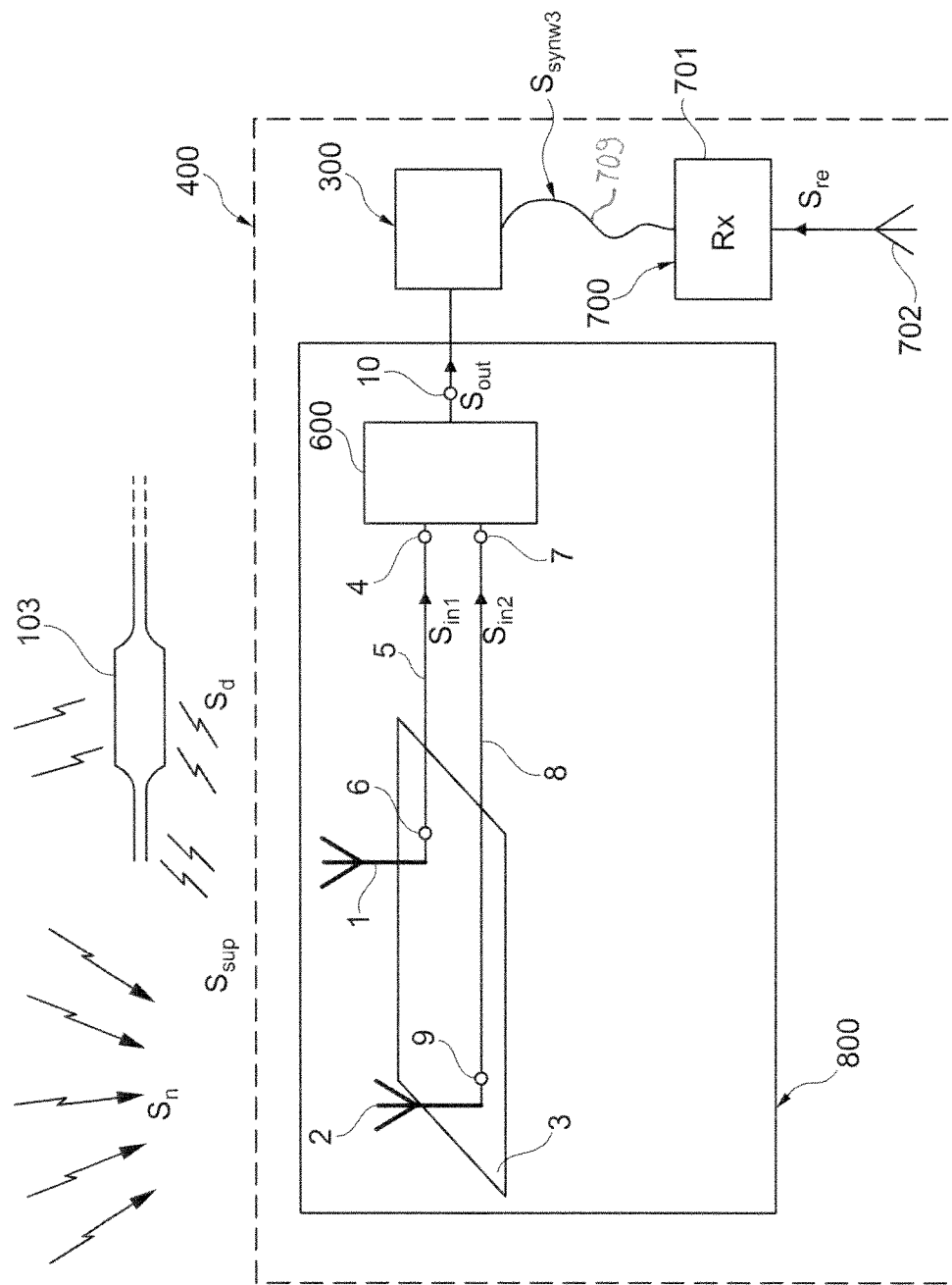
FIG. 6 shows a first embodiment of the partial discharge detection apparatus comprising a first antenna, second antenna, a difference module, a receiving antenna, a receiving module and an acquisition and analysis device.

FIG. 6 shows a first example of the partial discharge detection apparatus 400 comprising an example of the detection module 800, an analysis device 300 and the receiving module 700 (which is provided with another case 701) connected to the second antenna device 702.

The first antenna device 204 and the second antenna device 702 can be, as an example, one of the following antennas: a dipole, particularly made by a conductor wire segment or a whip antenna, antenna integrated in circuit printed board.

The second antenna device 702 is structured to pick up the second synchronization electromagnetic signal $S_{ES2}$ and provide a received electrical signal $S_{re}$ to the receiving module 700.

Figure 7:
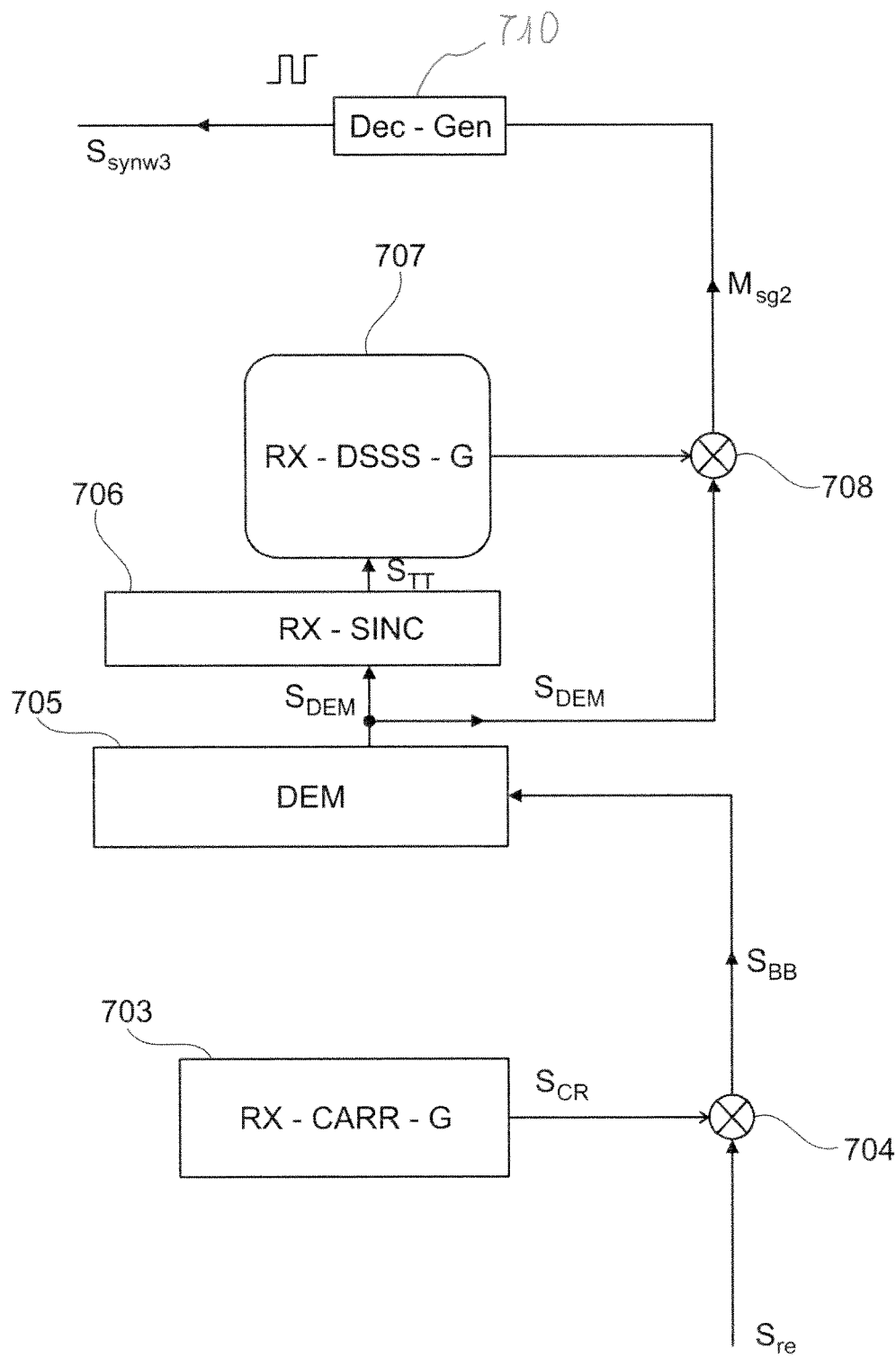
FIG. 7 shows an example of the receiving module of the partial discharge detection apparatus of FIG. 6.

FIG. 7 shows an example of the receiving module 700 which can be used to receive signals from the transmission module 203 of FIG. 5. This receiving module 700 comprises: a receiver carrier generator 703 (RX-CARR-G), a receiver frequency converter 704, a demodulator 705 (DEM), a receiver synchronizer module 706 (RX-SINC), a receiving spreading code generator 707 (RX-DSSS-G), a receiver multiplier 708 and a decoder generator 710 (Dec-Gen).

The receiver carrier generator 703 is configured to generate a corresponding carrier signal $S_{CR}$. Moreover, the receiver carrier generator 703 and the receiver frequency converter 704 are structured to convert the received electrical signal $S_{re}$ in a baseband signal $S_{BB}$. The demodulator 705 (DEM) is, as an example, structured to operate as an FSK demodulator or a GFSK demodulator providing a demodulated signal $S_{DEM}$. The receiver synchronizer module 706 is configured to provide synchronization signals $S_{TT}$ to the receiving spreading code generator 707 (RX-DSSS-G) which, together with the receiver multiplier 708, allows to de-spread the received signal obtaining second messages Msg2 which are the received version of the first messages Msg1. The decoder generator 710 starting from the second messages Msg2 produces a synthetized third synchronization electrical signal $S_{synw3}$ which represents timing information, such as the period and the phase, of the AC electrical voltage and is, preferably, a square wave corresponding to the synthetized second synchronization electrical signal $S_{synw2}$. The decoder generator 710 can be structured to perform a square wave synthesis employing a DPPL, as described with reference to FIG. 4.

The receiving module 700 is connected to the detection module 800 or, as shown in FIG. 6, to the acquisition and analysis device 300 by means of a cable structure 709 including a transmission line carrying the synthetized third synchronization electrical signal $S_{synw3}$ and, as an example, an electrical cable employed to supply electrical energy to the receiving module 700.

It is also observed that the transmitting module 203 can be provided with a further receiving module analogous to the receiving module 700 in order to receive configuration or control signals, as an example, from the partial discharge detection apparatus 400. Moreover, receiving module 700 can be also provided with a further transmitting module analogous to the transmitting module 203 to send configuration or control signals to the synchronization signal sensor device 200.

Referring back to FIG. 6, a particular embodiment of the partial discharge acquisition apparatus 400 will be described. The partial discharge acquisition apparatus 400 is configured to be placed in proximity of the second electrical device 103 to receive, according to a wireless and contact-less mode, discharge electromagnetic signals $S_d$ corresponding to partial discharge pulses emitted by the second electrical device 103. It is also observed that electromagnetic noise signals $S_n$ which could disturb the detection of the electromagnetic signals corresponding to the partial discharge pulses can be present in the area in which the partial discharge acquisition apparatus 400 is employed.

The discharge signals Sd to be detected can be electromagnetic wave pulses having frequencies included in the range 0.1 MHz to 100 MHz. The noise signals $S_n$ have typically frequencies included in the same range 0.1 MHz to 100 MHz.

According to an example, the partial discharge detection apparatus 400 (hereinafter also called "detection apparatus", for the sake of conciseness) comprises a first antenna 1 and a second antenna 2 which can both be mounted, as an example, on a shared support structure 3. The first antenna 1 is configured to receive the discharge signals $S_d$, but can also receive unwished electromagnetic noise signals $S_n$.

In greater detail, with reference to a first set of incoming directions of the radiation, the first antenna 1 is structured to show a first effective area $Aeff_1$ having a first value or values $Aeff_{1\text{-}dr1}$. Particularly, the first set of incoming directions corresponds to the incoming directions of the discharge signals $S_d$.

The second antenna 2 is configured to receive the electromagnetic noise signals $S_n$ present in the area in which the partial discharge acquisition apparatus 400 is employed. In some cases, the second antenna 2 can also receive discharge signals $S_d$. However, the second antenna 2 is structured to show a second effective area $Aeff_2$ that, for said first set of incoming radiation directions, has a second value or values $Aeff_{2\text{-}dr1}$ which is smaller than said first value $Aeff_{1\text{-}dr1}$ of the first antenna 1:

$$Aeff_{1\text{-}dr1} > Aeff_{2\text{-}dr1} \quad (1)$$

Particularly, the first value Aeff1-dr1 is at least ten times the second value $Aeff_{2\text{-}dr1}$.

The relation (1) for the first set of incoming radiation directions means that the first antenna 1 is more sensitive to the discharge signals $S_d$ than the second antenna 2.

With reference to a second set of incoming radiation directions, the first antenna 1 shows a first effective area $Aeff_1$ having third value or values $Aeff_{1\text{-}dr2}$ and the second antenna 2 shows a second effective area $Aeff_2$ having fourth value or values $Aeff_{2\text{-}dr2}$. Particularly, the second set of incoming directions corresponds to the incoming directions of the electromagnetic noise signals $S_n$.

In accordance with a particular embodiment, the partial discharge detection apparatus 400 is configured so that the following relation is valid for the first and second antenna 1 and 2, with reference to the second set of incoming directions:

$$Aeff_{2\text{-}r2} > Aeff_{1\text{-}dr2} \quad (2)$$

According to relation (2) the fourth value/s $Aeff_{2\text{-}dr2}$ are equal or larger than the third value/s $Aeff_{1\text{-}dr2}$. Particularly, the fourth value $Aeff_{2\text{-}dr2}$ is at least ten times the third value/s $Aeff_{1\text{-}dr2}$. The relation (2) for the second set of incoming radiation directions means that the second antenna 2 is equally or more sensitive to the electromagnetic noise signals $S_n$ than the first antenna 1.

In accordance with a first example, the first antenna 1 and/or the second antenna 2 are directional antennas. Particularly, the first antenna 1 and the second antenna 2 show different three dimensional radiations patterns. Particularly, the partial discharge detection apparatus 400 is designed in such a way that the first antenna 1 can provide a sensitive and accurate detection of the discharge signal $S_d$, so the first antenna 1 is designed in order to obtain that the first effective area $Aeff_1$ shows a largest value for the first set of incoming directions.

Moreover, the partial discharge detection apparatus 400 is designed in such a way that the second antenna 2 can provide detection of the noise signals $S_n$, so the second antenna 2 is designed in order to obtain that the second effective area $Aeff_2$ shows a largest value for the second set of incoming directions.

Preferably, the first antenna 1 has a directivity having a Front/Back parameter comprised between 3 and 30 dB; more preferably the Front/Back parameter is comprised between 6 dB and 10 dB. The second antenna 2 has a directivity having a Front/Back parameter greater than the Front/Back parameter of the first antenna 1 and, preferably, comprised between 10 and 30 dB; more preferably the Front/Back parameter of the second antenna 2 is comprised between 11 and 20 dB.

As an example, the first antenna 1 can be one of the following antennas: small patch antenna, loop antenna, dipole and ultra wideband antenna. A particular spherical antenna which can be used as the first antenna 1 will be described hereinafter.

The second antenna 2 can be, as an example a patch antenna, a loop antenna, a dipole, a ultra wideband antenna or a spherical antenna analogously to the first antenna 1. According to the first embodiment represented in FIG. 6, the partial discharge detection apparatus 400 further comprises a difference module 600 having a second input terminal 4 connected, by means of a first conductive line 5, to a second output terminal 6 of the first antenna 1 and a third input terminal 7 connected, by means of a second conductive line 8, to a third output terminal 9 of the second antenna 2.

Moreover, the first antenna 1 is configured to receive the discharge signals $S_d$ and the unwanted noise signal $S_n$ and convert them into a first received electrical signal $S_{in1}$ (e.g. an electrical current) available on the first conductive line 5. The second antenna 2 is configured to receive the noise signal $S_n$ and also a part of the discharge signals $S_d$ and convert them into a second received electrical signal Sin2 (e.g. a further electrical current) available on the second conductive line 8.

FIG. 8 shows, as an example, a first radiation diagram RD1 of the first antenna 1 and a second radiation diagram RD2 of the second antenna 2, as they could be when the first antenna and the second antenna 2 are positioned to operate for the detection. Particularly, FIG. 8 shows a vertical section of a first radiation pattern of the first antenna 1 and another vertical section of a second radiation pattern of the second antenna 2. A vertical section is a section between a vertical plane, as an example a plane perpendicular to the ground surface, and the respective pattern. As clear to the man skilled in the art, the radiation diagram of an antenna is substantially identical to the reception diagram of the same antenna. In accordance with the example shown in FIG. 8, the first diagram RD1 substantially lies in a first half-space while the second diagram RD2 substantially lies in the opposite half-space, with respect to a reference plane, e.g. parallel to a ground surface.

Particularly, the first radiation pattern of the first antenna 1 and the second radiation pattern of the second antenna 2 substantially do not overlap each other and, particularly, the first antenna 1 shows maximum values of the reception gain for incoming directions lying in the first half-space (to be oriented toward the expected partial discharge source). The second antenna 1 shows maximum values of the reception gain for incoming directions lying in the second half-space which is opposite to the first half-space.

Preferably, the first antenna 1 is arranged as an example, on the support structure 3, so as to have at least 90% of the received power of the first radiation pattern included in the first half-space, and the second antenna 2 is arranged, as an example, on the support structure 3 so as to have at least 90% of the received power of the second radiation pattern included in a second half-space opposite to the first half-space. As an example, the first antenna 1 and the second antenna 2 both show a Front/Back parameter of 20 dB and, particularly they are oriented in different and, preferably, opposite directions.

The difference module 600 of FIG. 1 is configured to generate a difference output signal $S_{out}$ representing a difference between the first electrical received signal $S_{in1}$ and the second received electrical signal $S_{in2}$. The difference module 600 is provided with a fourth output terminal 10 for the difference output signal $S_{out}$.

Figure 9:
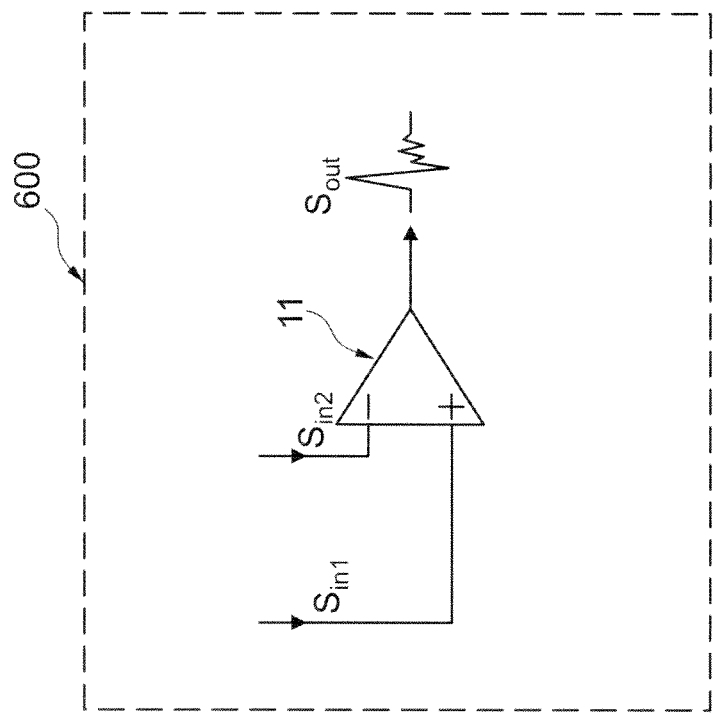
FIG. 9 schematically shows an active electronic component employable by said difference module.

According to an example shown in FIG. 9, the difference module 600 can comprise an active electronic device, such as an operational amplifier 11 or another type of discrete electronic active component, adapted to generate the difference output signal $S_{out}$. A particular embodiment of the difference module 600 employing the operational amplifier 11 will be described hereinafter.

Figure 10:
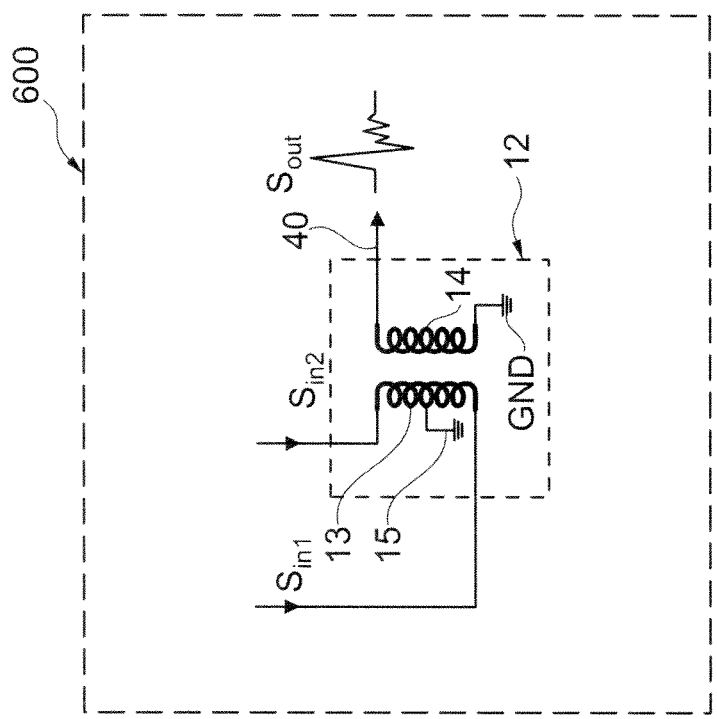
FIG. 10 schematically shows a centre tapped primary voltage transformer employable by said difference module.

In accordance with another example shown in FIG. 10, the difference module 600 can comprise a passive electronic device, such as an electrical transformer 11, adapted to generate the difference output signal $S_{out}$. The electrical transformer 12 is a high frequency transformer. In accordance with the example shown in FIG. 10, the high frequency transformer 12, which is in a central tapped configuration, includes a first winding 13 having two end terminals adapted to respectively receive the first received electrical signal $S_{in1}$ and the second received electrical signal $S_{in2}$ and a central terminal 15 connected to an electrical ground terminal GND. A second winding 14 of the high frequency transformer 12 is mutually coupled with the first winding 13 and is provided with a difference signal terminal 40 for the difference output signal $S_{out}$ and a ground terminal GND connected to the electrical ground.

With reference to the difference module 600, in accordance with another embodiment, it can also be structured to suitably treat the first received electrical signal $S_{in1}$ and the second received electrical signal $S_{in2}$ and so it can also comprises a high pass filtering module and optional equalization module placed before the operational amplifier 11 or the electrical transformer 12.

Figure 11:
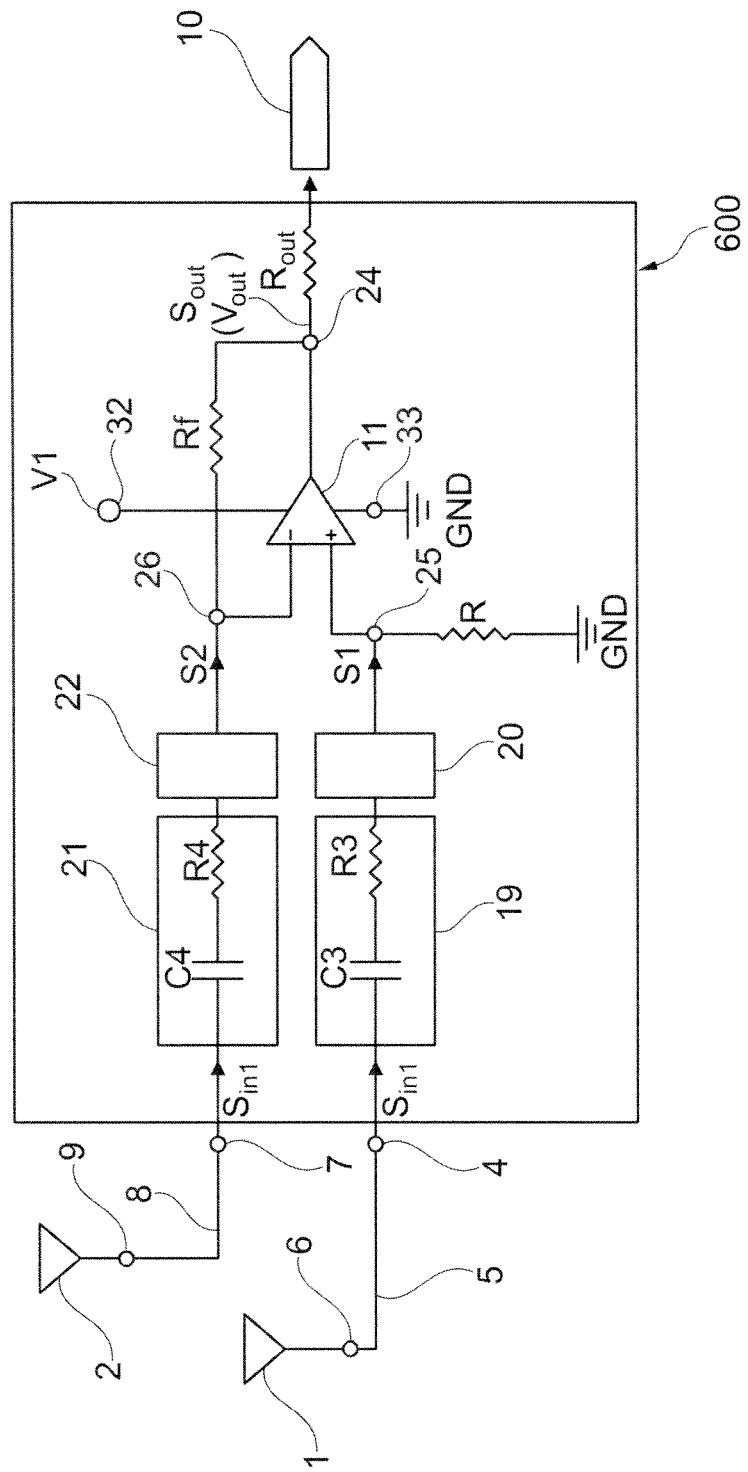
FIG. 11 is an embodiment of the difference module employing an operational amplifier.

FIG. 11 refers to an example of the difference module 600 in the case in which the operational amplifier 11 is employed. The difference module 600 comprises a first high pass filtering module 19 having a respective input connected to the second input terminal 4. As an example, the first high pass filter module 19 can include a third capacitor C3 connected in series with a third resistor R3. An output of the high pass filter module 19 is connected to an optional first equalization module 20 which is also connected to an non-inverting terminal "+" of the operational amplifier 11 via a third node 25. The third node 25 is connected to another resistor R which is also connected to the ground terminal GND.

The difference module 600 of FIG. 11 also comprises a second high pass filter module 21 having a respective input connected to the third input terminal 7. As an example, the second high pass filter module 21 can include a fourth capacitor C4 connected in series with a fourth resistor R4. The first and second high pass filter modules 19 and 21 are structured to filter a signal received by the first antenna 1 and the second antenna 2 and corresponding to the second synchronization electromagnetic signal $S_{ES2}$, at lower frequency, from the first and second received electrical signals Sin1 and $S_{in2}$, respectively.

An output of the second high pass filter module 21 is connected to an optional second equalization module 22 which is also connected to an inverting terminal "−" of the operational amplifier 11 via a fourth node 26. The operational amplifier 11 is provided with: a second supply terminal 32 for a supply voltage V1, a third supply terminal 33 connected to a ground terminal GND and the fifth output terminal 24 for the difference output signal $S_{out}$, which can be an output voltage $V_{out}$. The fifth output terminal 24 is connected to a fourth output terminal 10 by an output resistor Rout.

The output voltage $V_{out}$ is given by the difference of voltages applied to the non-inverting terminal "+" and the inverting terminal "−" multiplied by a gain factor $A_{op}$ of the operational amplifier 11. Particularly, the operational amplifier 11 is configured to show a bandwidth at least including the bandwidth of the first antenna 1 such as an example, a bandwidth ranging from 0.1 MHz to 100 MHz. The operational amplifier 11 can include one or more differential amplifiers each realized by means of transistors pair in differential configuration. A plurality of amplification stages can be included in the operational amplifier 11 to reach a wished amplifier gain. The third resistor R3, the fourth resistor R4 and the feedback resistor Rf show values of the respective resistances which can be chosen to design the gain factor $A_{op}$ of the operational amplifier 11 and to match the impedances of the first antenna 1 and the second antenna 2, respectively.

In accordance with a particular embodiment, the operational amplifier 11 is in the non-inverting negative feedback configuration and a feedback resistor Rf is connected between the fifth output terminal 24 and the fourth node 26 connected in turn to the inverting terminal "−". The negative feedback configuration allows obtaining a predictable behavior of the difference module 600. The first equalizer 20 and second equalizer 21 can be employed to compensate a possible difference of the frequency responses of the first antenna 1 and the second antenna 2.

In operation, the first antenna 1 is employed simultaneously with the second antenna 2. The first antenna 1 picks up, in accordance with its effective area diagram, the discharge signal $S_d$, the noise signal Sp contribution and the supply electromagnetic signal $S_{sup}$ and generates the first received electrical signal $S_{in1}$. The second antenna 2 picks up, in accordance with the respective effective area diagram, the noise signal $S_n$ and part of the discharge signal $S_d$ and generates the second received electrical signal $S_{in2}$. The second antenna 2 can also pick up the supply electromagnetic signal $S_{sup}$.

The first received electrical signal $S_{in1}$ and second received electrical signal $S_{in2}$ are fed to the difference module 600. With reference for example, to the embodiment of FIG. 11, the first received electrical signal $S_{in1}$ and second received electrical signal $S_{in2}$ are filtered respectively by the first high-pass filtering module 19 and the second high-pass filtering module 21. The optional first and second equalization modules 20 and 22 act on the first received electrical signal $S_{in1}$ and second received electrical signal $S_{in2}$ to equalize the frequency response difference of the first and second antennas 1 and 2 and obtain a first input signal $S_1$ and a second input signal $S_2$.

It is noticed that thanks to the above described conditions about the effective areas of the first antenna 1 and the second antenna 2, the first input signal $S_1$ carries a discharge signal $S_d$ contribution greater than the discharge signal $S_d$ contribution carried by the second input signal $S_2$ which substantially represents the noise $S_n$ contribution.

The first input signal $S_1$ is fed to the non-inverting terminal "+" and the second input signal $S_2$ is fed to the inverting terminal "−" of the operational amplifier 11. The operational amplifier 11 performs a difference between the first input signal $S_1$ and the second input signal $S_2$ generating the output different signal $S_{out}$ in which the noise contribution is reduced or substantially removed. The operational amplifier 11 allows subtracting the noise contribution present in the second input signal $S_2$ from the first input signal $S_1$.

It is observed that according to another embodiment the partial discharge detection apparatus 400 does not comprise the second antenna 2 and the difference module 600 since no detection of the noise signal $S_n$ is performed.

Figure 12:
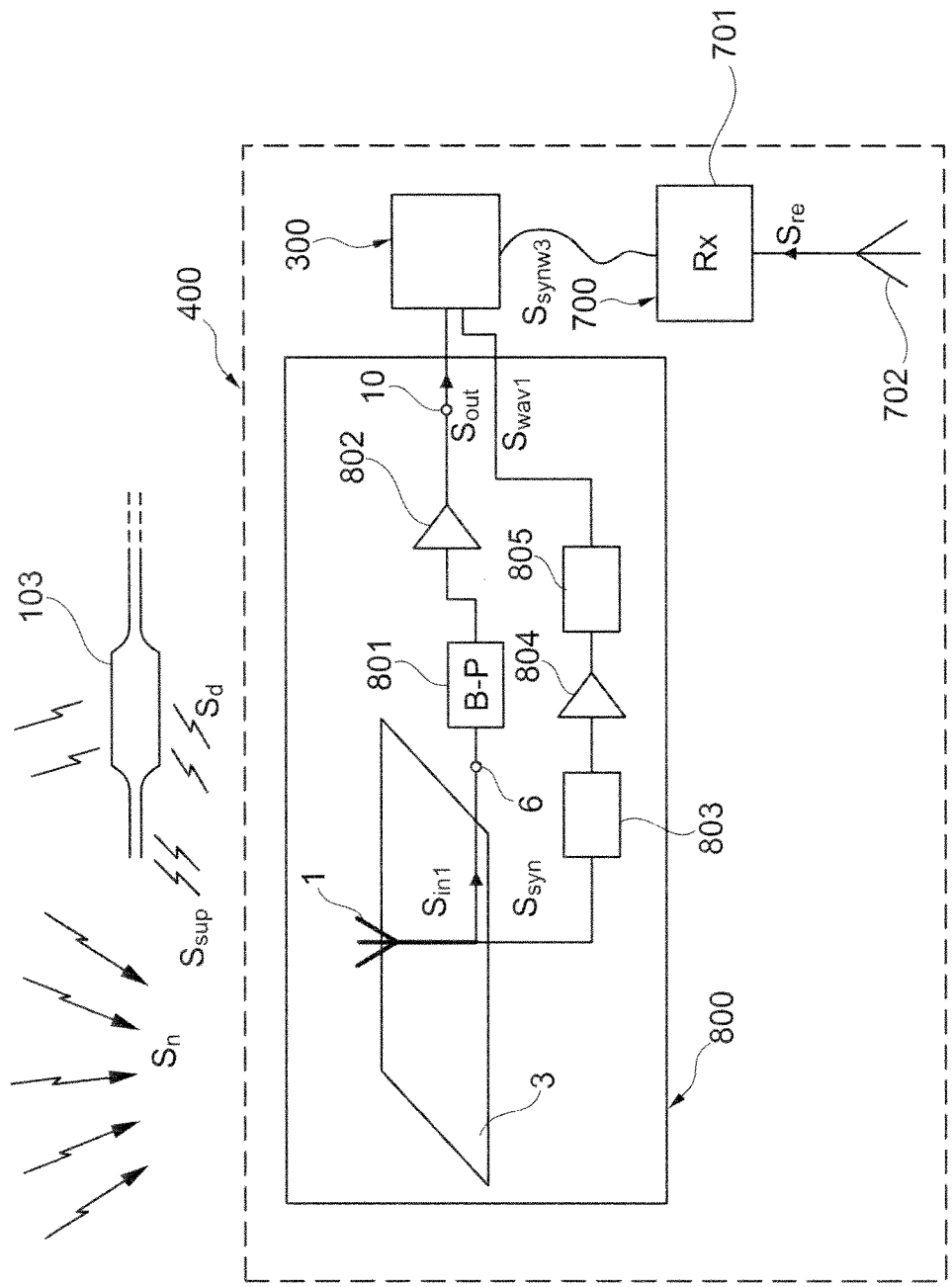
FIG. 12 schematically shows a second embodiment of the partial discharge detection apparatus, alternative to the first embodiment of FIG. 6, and comprising a partial discharge branch including a band-pass filter and a first amplifier and a synchronism branch comprising a low-pass filter and a second amplifier.

Particularly, FIG. 12 schematically shows an example of detection module 800, alternative to the one of FIG. 11, and comprising partial discharge branch including a band-pass filter 801 (B-P) having an input connected to the second output terminal 6 and an output connected to a first amplifier 802 having a respective output terminal connected to the third output terminal 10.

The band-pass filter 801 is designed to decouple a further detected synchronization signal $S_{syn}$ received at the antenna 1 from the first electrical received signal $S_{in1}$. The first amplifier 802 can be a high gain and high impedance amplifier. In this case, with the symbol $S_{out}$ in FIG. 12 is indicated an amplified and filtered version of the first received electrical signal $S_{in1}$.

The detection module 800 of FIG. 12 further includes a synchronism branch comprising a low-pass filter 803 (as an example, at a frequency of 1 kHz) connected between the first antenna 1 and a second amplifier 804. The lows-pass filter 803 allows filtering the first electrical received signal $S_{in1}$ and transmitting the further detected synchronization signal $S_{syn}$ to the second amplifier 804. The second amplifier 804 can be a high gain and high impedance amplifier. An optional further low-pass filter 805, configured to perform noise filtering, can be provided to produce a processed synchronization signal $S_{wav1}$ to the acquisition and analysis device 300. The further detected synchronization signal $S_{syn}$ and the detected processed synchronization signal $S_{wav}$ have substantially a sinusoidal trend.

Figure 13:
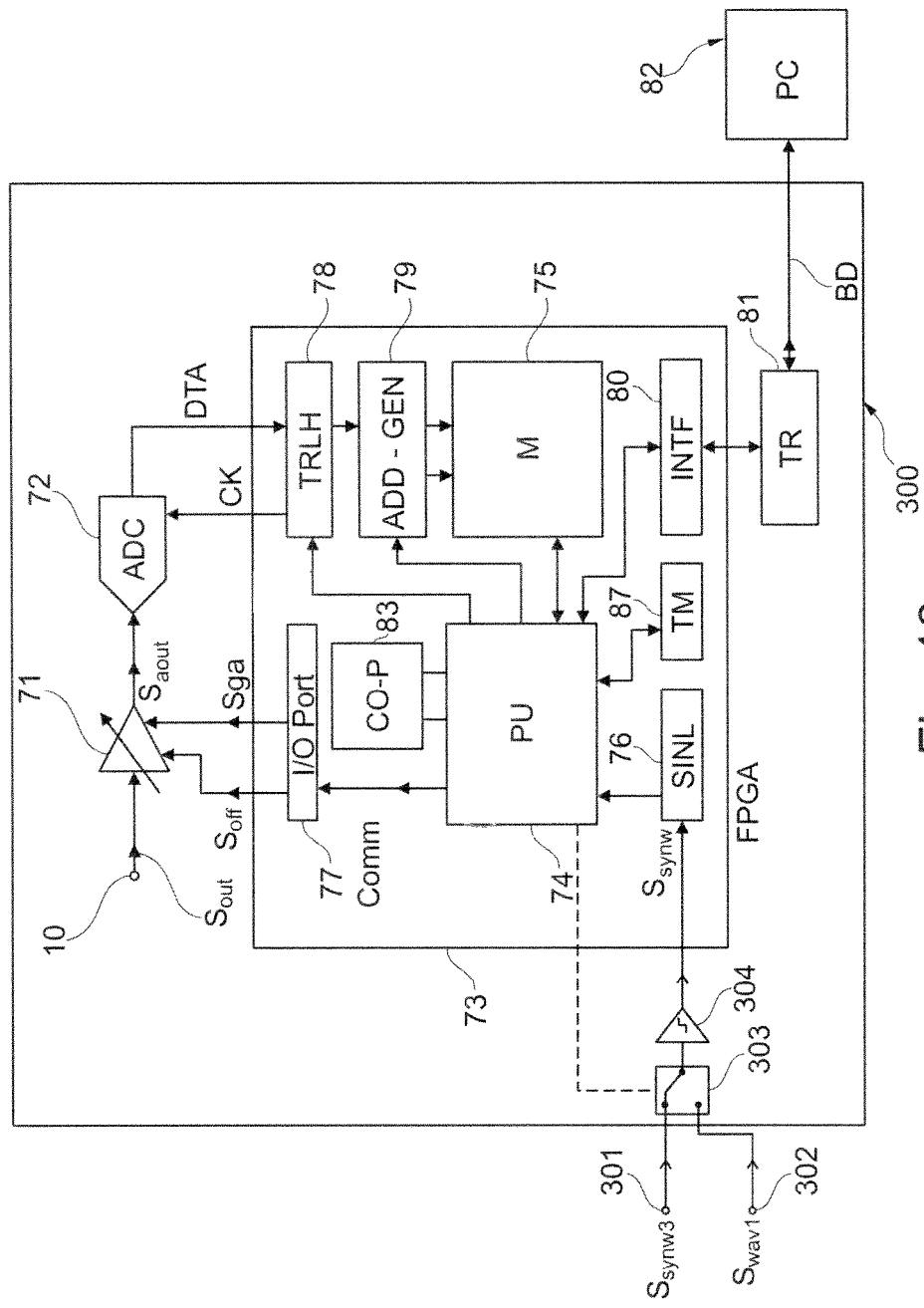
FIG. 13 illustrates an embodiment of the acquisition and analysis device shown in FIGS. 6 and 12.

The acquisition and analysis device 300 can be included in a housing also containing the partial discharge detection apparatus 400 or can be included in a separated housing. FIG. 13 schematically shows an embodiment of the acquisition and analysis device 300 comprising an optional wide band programmable amplifier 71 having an input connected to the third output terminal 10 of the detection module 800 and a respective output connected to a further analog-to-digital converter 72 (ADC). The acquisition and analysis device 300 also includes a control module 73 such a Field Programmable Gate Array (FPGA) which is structured to control the wide band programmable amplifier 71 and receive data from the further analog-to-digital converter 72. The wide band programmable amplifier 71 can be programmed to impart to the difference output signal $S_{out}$ (or the output signal $S_{out}$ of FIG. 12) an offset value and an amplification gain value by means of offset signal $S_{off}$ and a gain signal $S_{ga}$ provided by the control module 73, so producing an amplified output signal $S_{aout}$.

The wide band programmable amplifier 71 allows, as an example, a continuous gain variation ranging from about −5 dB to +40 dB. The further analog-to-digital converter 72 is structured to be synchronised by a clock signal CK generated by the control module 73 and generate converted data DTA to be sent to the control module 73. The further analog-to-digital converter 72 is, as an example, capable of converting 250 mega-samplers per second with an 8 bit resolution. This sampling frequency allows acquiring the difference electrical signal $S_{out}$ with a time resolution of 4 ns. It is observed that most partial discharge pulses are usually longer that 0.5 μs, the acquisition and analysis device 300 allows to acquire the pulse waveform and represent it with a number of samples comprised between 100 and 200.

The acquisition and analysis device 300 is also provided of a first input port 301 for the synthetized third synchronization electrical signal $S_{synw3}$ exiting the receiving module 700 and a second input port 302 for the processed synchronization signal $S_{wav1}$ exiting the further low-pass filter 805, if provided. A switch 303 is structured to selectively connect the first input port 301 or the second input port 302 to an input of a trigger device 304, such as Schmitt trigger, The Schmitt trigger 304 is structured to provide a square wave signal $S_{synw}$ and so it allows modifying the processed synchronization signal $S_{wav1}$ which usually has a sinusoidal waveform. However the Schmitt trigger 304 substantially does not alter the synthetized third synchronization electrical signal $S_{synw3}$ which shows a square waveform.

Particularly, the control module 73 includes a processing unit 74 (PU), such as a microprocessor, a memory 75 (M), such as a RAM (Random Access Memory), and a synchronization logic module 76 (SINL). More particularly, the memory 75 can be a circular buffer. The processing unit 74 is connected to a timing module 87 (TM) which provides a clock signal.

The synchronization logic module 76 is configured to receive the square wave signal $S_{synw}$ and extracting from it the carried timing information, such as the period and phase of the AC electric voltage, and transfer these information to the processing unit 74.

In order to take into account and compensate the deterministic transmission delay associated with the wireless communication link established between the synchronization signal sensor device 200 and the partial discharge detection apparatus 400, the square wave signal $S_{synw}$ can be offset by a specified phase angle; this phase shift of the square waveform signal $S_{synw}$ can be performed by the synchronization logic module 76 or by the processing unit 74 on the phase parameter as extracted from square wave signal $S_{synw}$.

Moreover, an input/out port 77 allows transferring output commands Comm generated by the processing unit 74 to the wide band programmable amplifier 71 under the form of the offset signal $S_{off}$ and the gain signal $S_{ga}$. The control module 73 is also provided with a trigger module 78 (TRLM) and by an address generation module 79 (ADD-GEN) configured to generate the addresses necessary to write new data in the memory 75 and read data stored in the memory 75, under the control of the processing unit 74.

The trigger module 78 is configured to trigger the memorisation of samples of the amplified output signal $S_{aout}$ exiting the wide band programmable amplifier 71 only for selected values of the amplified output signal $S_{aout}$ such as, for example, only for positive or negative pulses having amplitude (i.e. an absolute value) greater than a threshold level. The trigger logic module 78 can be a logic module comprising one or more comparators to compare the values of the samples provided by the analog-to-digital converter with one or more thresholds.

Moreover, the control module 73 comprises a host interface module 80 (INTF) allowing data transfer to a transceiver 81 (TR), such as an example a USB/Ethernet transceiver, which is configured to exchange data/commands with a further processor 82 (as an example, external to acquisition system 500) by a wired or wireless connection line BD. The external processor is configured to perform processing an analysis of the received data allowing, for example, representation of the discharge pulse behaviour on a display or memorization for subsequent processing and consulting. Particularly, the further processor 82 allows displaying and analyzing the partial discharge pulse waveforms and parameters, that can be phase referenced by using the synthesized third synchronization electrical signal $S_{synw3}$ and suitably compensated in accordance with the deterministic transmission delay.

The control module 73 can be also provided with an extraction module 83 (e.g. a co-processor CO-P) connected to the processing unit 74 which is configured to perform extraction, particularly, real-time extraction of pulse features from the data store in the memory 79. Examples of possible pulse features extracted by the co-processor are: peak value and polarity, phase, energy, duration and rough estimation of Weibull parameters.

Making also reference to FIG. 15, in operation the synchronization signal sensor device 200 can be placed in proximity of the first electrical device 101 to remotely detect the first electromagnetic signal $S_{ES1}$ by using one sensor among the capacitive sensor 205, the magnetic sensor 206 and the optical sensor 207 so generating the first synchronization electrical signal $S_{syn1}$. The processing module 250 filters and amplifies the first synchronization electrical signal $S_{syn1}$ generating the processed synchronization electrical signal $S_{syn1AF}$. The extracting module 251 extracts timing information carried by the first synchronization electrical signal $S_{syn1}$ and sends the second synchronization electrical signal $S_{syn2}$ or the synthetized second synchronization electrical signal $S_{synw2}$ to the transmitting module 203.

The transmitting module 203 processes, as an example, the synthetized second synchronization electrical signal $S_{synw2}$ irradiating the transmission electrical signal $S_{te}$.

The receiving module 700 of the partial discharge acquisition apparatus 400 receives the electrical signal $S_{te}$ and performs reception processing so providing the synthesized third synchronization electrical signal $S_{synw3}$ to be fed to the acquisition and analysis device 300.

Moreover, the partial discharge acquisition apparatus 400 detects the partial discharge signal $S_d$ and provides the difference output signal $S_{out}$, if the embodiment of FIG. 6 is employed, or the output signal $S_{out}$, if the embodiment of FIG. 12 is employed. The (difference) output signal $S_{out}$ representing the detected partial discharge signal $S_d$ is then supplied to the acquisition and analysis device 300. With reference to the acquisition and analysis device 300 operation, the control module 73 performs a configuration step and an acquisition step. In the configuration step acquisition parameters are established, such as the gain of the wide band programmable amplifier 71, the thresholds of the trigger logic module 78, and the selecting position of the switch 303. Also the transmission delay, which is a positive time offset, generated by the wireless communication link is measured and stored in the configuration step In the acquisition step the processing unit 74, the trigger logic module 78 and the address generation module 79 manage the storing in the memory 75 of the data corresponding to the difference output signal $S_{out}$. When the trigger logic module 78 detects a trigger events (as an example, the values of the samples provided by the analog-to-digital converter 72 are higher than the threshold), the acquisition of further data is stopped. The processing unit 74 collects the timing information from the synchronization logic module 76 and the timing module 87 and sends the corresponding timing information together with the data stored in the memory 75 corresponding to the acquired output signal $S_{out}$ to the external processor 82.

The partial discharge acquisition apparatus 400 can also include one or more batteries for supply electrical voltage to the above described modules.

FIGS. 14A and 14B show two different views of a preferred embodiment of the partial discharge acquisition system 400 of FIG. 6, not showing the receiving module 700, as realized by the Applicant and comprising particular embodiments of the first antenna 1, the second antenna 2 and the support structure 3. In greater detail, the first antenna 1 is a directional antenna and, particularly, is a wideband, non resonant antenna comprising a first antenna conductor 90 and a planar conductor 91 acting as a ground plane. The first antenna conductor 90 is electrically isolated with respect the planar conductor 91 and they operate poles of the first antenna 1. Particularly, the first antenna conductor 90 is spherical shaped and includes a hollow sphere in electrically conducting material such as, an example, metal or polymer material. The spherical shaped first antenna conductor 90 shows, as an example, a diameter comprised between 3 and 30 cm, preferably comprised between 5 and 20 cm.

The first antenna conductor 90 is supported by an insulated support 93 which is fixed on the support structure 3 which is, according to the example made, a printed circuit board (PCB) including electronic circuits corresponding to the difference module 600 and the acquisition and analysis device 300. The ground plane 91 is placed on a first side of the support structure 3 which is faced to the antenna conductor 90 and is implemented as a metallic laminate.

In accordance with the example made, the second antenna 2 comprises a respective ground plane, which can be the same ground plane 91 of the first antenna 1, and a second antenna conductor 94. The second antenna conductor 94 is an electrically small antenna, designed to obtain similar electrical characteristics as the first antenna conductor 90 and to be non-resonant in the band of interest. In particular, the second antenna conductor 94 can be a small dipole, loop or spiral antenna. In the embodiment represented in FIGS. 9A and 9B, the second antenna conductor 94 is a patch antenna realized in a second side of the support structure 3 opposite to the first side. In accordance with an example, the patch antenna 94 is realized as an area of copper covering between ¼ and ½ of the support structure 3 also acting as printed circuit board, when a 1.6 mm thick FR4 laminate is used as to make the printed circuit board 3. This provides similar electrical characteristics as the first antenna conductor 90. The printed circuit board 3 is provided with electrical terminals on both sides to contact the first antenna conductor 90 and the second antenna conductor 94.

The embodiment shown in FIGS. 14A and 14B allows a very compact and robust implementation, assures an appropriate complementary radiation pattern and it does not affect the frequency response of the first conductor antenna 90, so not distorting the received partial discharge pulses $S_d$. Due to the presence of the ground plane 91, the radiation pattern of the first and second antenna 1 and 2 is directional as depicted in FIG. 4 so extending toward opposite semi-spaces. This provides an exposition and sensitivity for the partial discharge signal $S_d$ and for the environmental noise $S_n$ of the first antenna 1 and second antenna 2, respectively, which shows good performances.

In accordance with further embodiments, the first antenna conductor 90 can also have another bi-dimensional or three-dimensional shape, such as a planar shape, e.g.: triangle shape, cusp shape or disc shape. The first antenna conductor 90 can be analogous to the antenna described in patent application WO-A-2009-150627.

With reference to a further embodiment of the partial discharge detection apparatus 400, the first antenna 1 and/or the second antenna 2 can be external to a portable case 701 including the partial discharge detection apparatus 400 and respectively connected to the difference module 600 by the first connection line 5 and the second connection line 9 which are corresponding electrical cables. In accordance with this embodiment, at least one of the first antenna 1 and the second antenna 2 are preferably directional antennas.

Preferably, the first antenna 1 is housed into the case comprising the partial discharge detection apparatus 400 as depicted in FIG. 1 while the second antenna 2 is external to the partial discharge detection apparatus 400 and can be moved to be suitably oriented. According to this preferred embodiment, the second antenna 2 is a directional antenna having, as an example, the second radiation diagram RD2 shown in FIG. 8.

In accordance with this preferred embodiment, the partial discharge detection apparatus 400 is positioned to orient the first antenna 1 towards the electrical object 100 to receive the partial discharge signal $S_d$ so showing a first receiving effective area for the incoming directions of the partial discharge signal $S_d$.

The movable second antenna 1 is oriented so as to receive the electromagnetic noise signal $S_n$ and to show a second receiving effective area for the incoming directions of the of the partial discharge signal $S_d$ which is smaller than said first receiving effective area. The first antenna 1 is oriented to be more sensitive to the partial discharge signal $S_d$ than the second antenna 2. The second antenna 2 is oriented to be more sensitive to electromagnetic noise signal $S_n$ than the first antenna 1. The possibility of moving the second antenna 2 allows to reduce the power amount of the partial discharge signal $S_d$ received by the second antenna 2 in comparison with the power amount of the partial discharge signal $S_d$ received by the first antenna 1. The processing of the electrical signals generated by the first antenna 1 and the second antenna 2 is analogous to the one described above with reference to the partial discharge detection apparatus 400 of FIG. 6.

In accordance with another embodiment of the partial discharge acquisition system 500, a plurality of synchronization signal sensor devices analogous to the synchronization signal sensor device 200 and a plurality of partial discharge detection apparatuses analogous to the partial discharge detection apparatus 400 can be configured to operate as a mesh network. Particularly, each synchronization signal sensor device 200 and each partial discharge detection apparatuses 400 is structured to be a network node adapted not only to capture and disseminate its own detected data, but also to serve as a relay for other nodes, so collaborating to propagate the data relating to the synchronization signal in the network.

The values of the transmission delays associated with pairs of nodes of the mesh network, also comprising transmission delay a plurality can be evaluated in a network configuration step and these evaluated values can be suitably used to temporally shift the synchronization signal as received at an endpoint node.

It is noticed that the deterministic transmission delay associated with the communication link established between the synchronization signal sensor device 200 and the partial discharge detection apparatus 400 shows the advantage of allowing to obtain reliable synchronization information to be used in analyzing and displaying the partial discharge signal.

It is also observed that the synchronization signal sensor device 200 does not need to be connected to the electrical object 101 and is completely autonomous from the partial discharge detection device 400: this shows the advantage that there is no need to shut down the first electrical cable supplying power to the electrical object 101.

Moreover, a very high degree of safety is obtained for the operator, since there is no galvanic connection of the operator neither with the second electrical device 103 under test nor with the synchronization signal sensor device 200.

The partial discharge acquisition system 500 allows the operator to perform measures in places (components, part of a plant or long cable joints) where it would be difficult or would be impossible to obtain a proper synchronization signal with conventional techniques. In addition, the synchronization signal sensor device 200 is able to sense the AC electrical voltage, even when a capacitive coupler is not present in the test area, so allowing to obtain a signal with reduced or no phase error compared to the one obtained by known sensors (which are traditionally used when no capacitive coupler are present), that show a phase that is dependent on the line load.

The invention claimed is:

1. A partial discharge acquisition system comprising:
   a synchronization signal sensor device comprising:
   a sensor module structured to remotely detect a first synchronization electromagnetic signal generated by an alternate current electrical voltage associated with the operation of an electrical object and provide a corresponding first detected electrical signal;
   a transmitting device structured to irradiate a second synchronization electromagnetic signal related with said first detected electrical signal; and
   a partial discharge detection apparatus comprising:
   a receiving device structured to receive said second synchronization electromagnetic signal and generate a corresponding received electrical signal representing at least a timing parameter of said alternate current electrical voltage, the receiving device and the transmitting device being configured to establish a wireless communication link defining a deterministic transmission delay,
   a detection module configured to detect a partial discharge signal and provide an output electrical signal representing said partial discharge signal;
   an acquisition device configured to acquire said output electrical signal representing the partial discharge signal basing on said received electrical signal.

2. The system of claim 1, wherein the receiving device and the transmitting device are structured so that said wireless communication link is selected from a radio link and an infrared link.

3. The system of claim 2, wherein the receiving device and the transmitting device are structured so that said wireless communication link is a short-range link.

4. The system of claim 3, wherein the receiving device and the transmitting device are structured so that said short-range link is based on a technology standard selected from: a wireless personal area network standard and a wireless local area network standard.

5. The system of claim 3, wherein the receiving device and the transmitting device are structured so that said wireless communication link operates in an ISM, Industrial Scientific Medical, band.

6. The system of claim 1, wherein the receiving device and the transmitting device are structured so that said wireless communication link is based on a radio link selected from: Amplitude Modulation AM radio link, Frequency Modulation FM radio link and Short Wave SW radio link.

7. The system of claim 1, wherein the receiving device and the transmitting device are structured so that the deterministic transmission delay has a latency lower than 100 μs.

8. The system of claim 1, wherein the receiving device and the transmitting device are structured so that said wireless communication link is based on continuous flux transmissions employing real-time and unbuffered streams.

9. The system of claim 1, wherein the receiving device and the transmitting device are configured to operate according to a spreading code technique and according a frequency shift keying modulation.

10. The system of claim 1, further comprising:
a further synchronization signal sensor device comprising:
a further sensor module structured to remotely detect a further first synchronization electromagnetic signal generated by a further alternate current electrical voltage associated with the operation of a further electrical object and provide a corresponding further first detected electrical signal;
a first transmitting-receiving device structured to irradiate a further second synchronization electromagnetic signal related to said further first detected electrical signal; and
a further partial discharge detection apparatus comprising:
a second transmitting-receiving device structured to receive said further second synchronization electromagnetic signal and generate a corresponding further received electrical signal representing at least a further timing parameter of said further alternate current electrical voltage, wherein at least one of said first transmitting-receiving device and said second transmitting-receiving device is configured to operate as intermediate node of a mesh network further comprising the transmitting device and the receiving device to establish said wireless communication link to transmit and receive said second synchronization electromagnetic signal.

11. The system of claim 1, wherein said partial discharge detection apparatus further comprises:
a control module structured to evaluate said deterministic transmission delay in a configuration step of the partial discharge detection apparatus; and
a processing unit structured to shift a phase of the received electrical signal of said evaluated deterministic transition delay producing a shifted received electrical signal.

12. The system of claim 11, wherein said partial discharge detection apparatus comprises:
a detection module configured to receive an electromagnetic signal associated with partial discharges of an electric component and to generate a first discharge electrical signal;
an analog-to-digital converter structured to produce from said first discharge electrical signal a plurality of corresponding samples representing the electromagnetic signal;
a memory configured to store selected samples of said plurality of samples; and
a display device configured to display a discharge trend corresponding to said selected samples and synchronized with the shifted received electrical signal.

13. The system of claim 1, wherein said transmitting device comprises:
an extracting module configured to extract timing parameters carried by the first detected electrical signal and generate a synthesized signal based on said first detected electrical signal.

14. The system of claim 13, wherein said extracting module comprises:
a measuring module for measuring said timing parameters; and
a generation module to synthetize from said timing parameters the synthesized signal having a square wave shape.

15. The system of claim 14, wherein said transmitting device further comprises:
a message generator configured to generate a message at each rising edge of the synthetized signal.

16. The system of claim 1, wherein said sensor module further comprises:
a sensor module output;
a first sensor device structured to remotely detect the first synchronization electromagnetic signal and provide a corresponding first voltage signal on a first output;
at least a second sensor device structured to remotely detect the first synchronization electromagnetic signal and provide a second voltage signal on a second output; and
a selection module to select the first sensor device or the at least second sensor device by selectively connecting the first output and the second output to said sensor module output.

17. The system of claim 16, wherein said first sensor device comprises at least one sensor selected from: a capacitive sensor, a magnetic sensor, and an optical sensor.

18. The system of claim 17, wherein the optical sensor is configured to pick-up a luminous signal generated by a light source fed by the alternate current electrical voltage and generate a third voltage signal on a third output.

19. A partial discharge acquisition method comprising:
remotely detecting a first synchronization electromagnetic signal generated by an alternate current electrical voltage associated with an operation of an electrical object and providing a corresponding first detected electrical signal;
providing a transmitting device configured to process said first detected electrical signal;
irradiating by the transmitting device a second synchronization electromagnetic signal related with said first detected electrical signal;
providing a partial discharge detection apparatus comprising a receiving device;
establishing a wireless communication link between the receiving device and the transmitting device associated with a deterministic transmission delay; and
receiving at said receiving device the second synchronization electromagnetic signal and generating a corresponding received electrical signal representing at least a timing parameter of said alternate current electrical voltage,
detecting by the partial discharge detection apparatus a partial discharge signal and providing an output electrical signal representing said partial discharge signal;
acquiring said output electrical signal representing the partial discharge signal basing on said received electrical signal.

* * * * *